United States Patent
Mbanaso

(10) Patent No.: US 11,020,774 B2
(45) Date of Patent: Jun. 1, 2021

(54) MICROELECTRONIC TREATMENT SYSTEM HAVING TREATMENT SPRAY WITH CONTROLLABLE BEAM SIZE

(71) Applicant: TEL MANUFACTURING AND ENGINEERING OF AMERICA, INC., Chaska, MN (US)

(72) Inventor: Chimaobi W. Mbanaso, Chaska, MN (US)

(73) Assignee: TEL MANUFACTURING AND ENGINEERING OF AMERICA, INC., Chaska, MN (US)

( * ) Notice: Subject to any disclaimer, the term of this patent is extended or adjusted under 35 U.S.C. 154(b) by 0 days.

(21) Appl. No.: 16/278,398

(22) Filed: Feb. 18, 2019

(65) Prior Publication Data

US 2019/0255580 A1 Aug. 22, 2019

Related U.S. Application Data

(60) Provisional application No. 62/632,131, filed on Feb. 19, 2018.

(51) Int. Cl.
| | |
|---|---|
| *B08B 3/02* | (2006.01) |
| *B08B 11/00* | (2006.01) |
| *B08B 5/04* | (2006.01) |
| *B08B 5/02* | (2006.01) |

(52) U.S. Cl.
CPC ............ *B08B 3/02* (2013.01); *B08B 5/02* (2013.01); *B08B 5/04* (2013.01); *B08B 11/00* (2013.01)

(58) Field of Classification Search
CPC combination set(s) only.
See application file for complete search history.

(56) References Cited

U.S. PATENT DOCUMENTS

| | | |
|---|---|---|
| 3,538,883 A | 11/1970 | Polin |
| 5,554,964 A | 9/1996 | Jansseune |
| 5,598,974 A | 2/1997 | Lewis et al. |
| 5,730,803 A | 3/1998 | Steger et al. |
| 5,961,732 A | 10/1999 | Patrin et al. |
| 5,965,047 A | 10/1999 | Blersch et al. |
| 6,146,463 A | 11/2000 | Yudovsky et al. |
| 6,168,665 B1 | 1/2001 | Sakai et al. |

(Continued)

FOREIGN PATENT DOCUMENTS

| | | |
|---|---|---|
| KR | 20110036915 A | 4/2011 |
| WO | 2010054076 A2 | 5/2010 |

OTHER PUBLICATIONS

PCT/US2019/018405 PCT International Search. Report, dated May 6, 2019, 2018, 3 pgs.

(Continued)

*Primary Examiner* — Erin F Bergner
(74) *Attorney, Agent, or Firm* — Kagan Binder, PLLC

(57) ABSTRACT

This invention relates to systems and methods that produce a treatment beam with a controllable beam size. This is accomplished by providing an auxiliary chamber in open fluid communication with the main process chamber. A nozzle is mounted in a recessed manner in the auxiliary chamber. The nozzle dispenses a treatment spray into the auxiliary chamber. The auxiliary chamber shapes and dispenses the treatment material as a treatment beam into the process chamber. In illustrative embodiments, control of process chamber pressure adjusts the beam size of a treatment beam used to treat the surface of one or more microelectronic substrates.

26 Claims, 10 Drawing Sheets

(56) References Cited

U.S. PATENT DOCUMENTS

| | | |
|---|---|---|
| 6,217,423 B1 | 4/2001 | Ohmori et al. |
| 6,241,577 B1 | 6/2001 | Shibata |
| 6,290,569 B1 | 9/2001 | Mizuno et al. |
| 6,435,798 B1 | 8/2002 | Satoh |
| 8,844,546 B2 | 9/2014 | Chen et al. |
| 9,564,378 B2 | 2/2017 | Rose et al. |
| 9,837,260 B2 | 12/2017 | Inai et al. |
| 10,418,270 B2 | 9/2019 | Hanzlik et al. |
| 2002/0017237 A1 | 2/2002 | Wirth et al. |
| 2002/0157686 A1 | 10/2002 | Kenny et al. |
| 2003/0015141 A1 | 1/2003 | Takagi |
| 2003/0132746 A1 | 7/2003 | Cox |
| 2003/0156270 A1 | 8/2003 | Hunter |
| 2003/0178145 A1 | 9/2003 | Anderson et al. |
| 2003/0230323 A1 | 12/2003 | You et al. |
| 2004/0004713 A1 | 1/2004 | Go et al. |
| 2004/0005212 A1 | 1/2004 | Wu |
| 2004/0163670 A1 | 8/2004 | Ko et al. |
| 2004/0221877 A1 | 11/2004 | Bergman |
| 2005/0031497 A1 | 2/2005 | Siebert et al. |
| 2005/0127927 A1 | 6/2005 | Harris et al. |
| 2006/0162739 A1 | 7/2006 | Sogard |
| 2006/0182528 A1 | 8/2006 | Fan et al. |
| 2007/0209684 A1 | 9/2007 | Chen et al. |
| 2007/0247778 A1 | 10/2007 | Harb et al. |
| 2008/0056857 A1 | 3/2008 | Hiroki |
| 2008/0229811 A1 | 9/2008 | Zhao et al. |
| 2008/0280453 A1 | 11/2008 | Koelmel et al. |
| 2009/0114253 A1 | 5/2009 | Matsumoto |
| 2009/0314211 A1 | 12/2009 | Du Bois et al. |
| 2010/0012856 A1 | 1/2010 | Aoki |
| 2011/0188974 A1 | 8/2011 | Diamond |
| 2012/0325275 A1 | 12/2012 | Goodman et al. |
| 2013/0062839 A1 | 3/2013 | Tschiderle et al. |
| 2013/0152971 A1 | 6/2013 | Kato |
| 2013/0214497 A1 | 8/2013 | Yoshida |
| 2013/0233356 A1 | 9/2013 | Obweger et al. |
| 2014/0152976 A1 | 6/2014 | VanHoomissen et al. |
| 2014/0166055 A1 | 6/2014 | Haung et al. |
| 2014/0332161 A1 | 11/2014 | Ricci et al. |
| 2015/0187629 A1 | 7/2015 | Obweger et al. |
| 2015/0279708 A1 | 10/2015 | Kobayashi et al. |
| 2016/0096207 A1 | 4/2016 | Butterbaugh et al. |
| 2016/0172256 A1 | 6/2016 | Rose et al. |
| 2017/0338131 A1 | 11/2017 | Amahisa et al. |
| 2018/0130694 A1 | 5/2018 | Inhofer et al. |
| 2018/0151396 A1 | 5/2018 | Hanzlik et al. |
| 2018/0158717 A1 | 6/2018 | Hanzlik et al. |
| 2018/0214915 A1 | 8/2018 | Butterbaugh |

OTHER PUBLICATIONS

PCT/US2017/0695166, PCT International Search Report, dated Mar. 29, 2018, 3 pgs.

PCT/US2014/069557, PCT International Search Report, dated Mar. 3, 2015, 4 pgs.

PCT/US2017/063486, PCT International Search Report, dated Mar. 5, 2018, 3 pgs.

PCT/US2017060543, PCT International Search Report, dated Feb. 20, 2018, 5 pgs.

PCT/US2018/015545, PCT International Search Report, dated May 14, 2018, 4 pgs.

MICROELECTRONIC TREATMENT SYSTEM HAVING TREATMENT SPRAY WITH CONTROLLABLE BEAM SIZE

PRIORITY

This application claims priority to U.S. Provisional Patent Application No. 62/632,131, filed Feb. 19, 2018, titled "Microelectronic Treatment System Having Treatment Spray with Controllable Beam Size," the entire disclosure of which is incorporated herein by reference for all purposes.

FIELD OF USE

This disclosure relates to an apparatus and method for treating the surface of one or more microelectronic substrates, e.g., cleaning residue, debris, and other materials from a surface of a microelectronic substrate. More specifically, the disclosure relates to such an apparatus in which pressure is controlled to adjust the beam size of a treatment stream used to treat the surface of one or more microelectronic substrates.

BACKGROUND OF THE INVENTION

Advances in microelectronic technology cause integrated circuits (ICs) to be formed on substrates, such as semiconductor substrates, with ever increasing density of active components. The formation of ICs is carried out by sequential application, processing, and selective removal of various materials on the substrate. And, during formation, the exposed surface of the substrate requires cleaning steps to periodically remove process residue and debris. Various compositions have been developed for removal of specific classes of materials from substrates in semiconductor substrate processing, including both dry and wet cleaning technologies. Additionally, several different types of equipment are used to expose substrates to cleaning chemistries under a variety of conditions. An important aspect of this equipment is to achieve high throughput while cleaning the substrate in a uniform manner and minimize any debris or particles being generated by the equipment.

One cleaning strategy known in the microelectronic industry uses streams of particles to remove contaminants from workpiece surfaces. These may include streams of gas, liquid, and/or solid particles. A commercially important class of these treatments is known as cryogenic treatments. Cryogenic treatments use one or more suitable nozzles to expand a pressurized and cooled fluid (which can be liquid and/or gas and may include some entrained solid material as supplied to the nozzle) into a low pressure process chamber. This causes the fluid to generate a treatment stream of energetic gas, liquid, and/or solid particles. The energy of this stream is used to dislodge and remove contaminants from surfaces. Various types of cryogenic treatment streams are known as cryogenic aerosols, cryogenic aerosol jets, nano-aerosol particles, gas jet clusters, and the like. Excellent examples of cryogenic cleaning tools are available under the trade designations ANTARES®, ANTARES™-Nano and ARCTURUS™ from TEL FSI, Inc., Chaska, Minn., USA.

In a typical cryogenic treatment, the treatment spray is dispensed from at least one nozzle into a processing chamber maintained under a suitable vacuum. A workpiece in the form of a microelectronic substrate is held on a substrate holder, such as a rotatable or translatable chuck in the case of the ANTARES tool. In a rotating configuration, a nozzle would scan a rotating substrate like a record player needle scans a record. However, a scanning nozzle is less practical in a cryogenic tool, because a cryogenic rotary coupling has been difficult to provide in a practical manner. As an alternative to scanning a rotating substrate, a cryogenic tool such as the ANTARES tool has been configured with translating chucks that pass the substrate under a nozzle along a path that spans the substrate. The translation and/or rotation of the chuck, in effect, cause the nozzle to treat all or a portion of the substrate surface as desired.

Substrate cleaning equipment has been designed in several ways to achieve efficient and uniform cleaning results while minimizing particles and achieving high throughput. A significant challenge is to use cryogenic treatments to remove smaller particles, e.g., contaminant particles having a size under about 100 nm. Generally, smaller particles are harder to remove than larger particles. Hence, any improvements to cleaning efficiency (e.g., particle/defect reduction) or uniformity, particularly with respect to smaller particles while also improving throughput, would be desirable within the industry.

SUMMARY

This invention relates to systems and methods that produce a treatment beam with a controllable beam size. In illustrative embodiments, control of process chamber pressure adjusts the beam size of a treatment beam used to treat the surface of one or more microelectronic substrates. Using pressure to control beam size is advantageous, as physical changes to the processing environment are not required to tune the treatment beam within a wide range of size options for a given tool configuration. Beam size can be tuned in the course of a treatment or among different treatments in order to influence the beam size to tune its ability to treat or clean a substrate. This present invention is particularly useful in the semiconductor and microelectronic industry for treating substrates such a semiconductor wafers. Unwanted particle contamination on semiconductor substrates can negatively impact the device yield, hence the need to reduce particles at different stages of the semiconductor manufacturing process.

This invention discloses strategies to adjust the beam size of a flow from a nozzle into a more or less focused treatment beam in order to clean particles from a substrate. The strategies use chamber features and the adjustment of the chamber pressure of the vacuum environment to tune the treatment beam to form a more or less focused beam to increase the removal efficiency of particles.

It has been discovered that mounting the nozzle into an auxiliary chamber helps to shape the treatment spray and to provide a more well-defined treatment beam whose size and focus can be easily adjusted on demand. For example, adjusting the chamber pressure of the vacuum system easily and rapidly tunes the treatment beam size, e.g., to make it more focused or more diffuse on demand. This offers the benefit to increase the particle removal efficiency on the substrate as the beam can be tuned to optimize cleaning performance for different kinds of contamination.

Generally, the smaller, more focused treatment beams provide cleaning directly below the nozzle, whereas the more diffuse beams clean a larger annular region radially further outward relative to the footprint of the nozzle over the wafer. The smaller beam is created with higher chamber pressure (e.g., 19 Torr in some modes of practice), while the more diffuse beam results from using a lower chamber pressure (e.g., about 4 Torr in some embodiments). The smaller beam generally flows directly downward onto the wafer in substantial alignment with the z-axis. The smaller beam may be more desirable to remove smaller particles, to clean recesses such as trenches as such recesses are in line-of-sight communication with the nozzle, or to protect delicate features that might be more likely to be damaged by lateral or angled flows. The more diffuse beam tends to impact the wafer more laterally. The more diffuse beam may be more desirable to use where higher throughput is desired, where more robust features are present, or the like.

The performance of the present invention is counter to conventional wisdom. Conventional wisdom generally correlates lower chamber pressures with better cleaning performance. Using the shaped beam strategies of the invention, higher pressures allow better cleaning performance directly under the nozzle.

In the practice of the present invention, the chamber pressure can be adjusted to quickly focus and collimate the flow to improve cleaning. This adjustment occurs rapidly in real time within a process recipe. Tool shutdown and reconfiguration is not required. Pressure profiles can be used within a treatment to optimize beam energy for different kinds of particles. The adjustment is fast enough that the beam can be tuned on the same wafer, if desired, so that some portions are treated by a relatively smaller, more focused beam, while other portions are treated by a larger, more diffuse beam. As another option, different beam sizes can be used to treat common areas in a sequence, if desired.

This method provides an avenue to overcome limited particle removal efficiency especially at small particle sizes less than 100 nm and enhances the probability to attain the required directionality needed to dislodge particles from the substrate directly underneath the nozzle. Advantages of such a perpendicular, collimated aerosol flow path include cleaning of smaller particles (<100 nm) directly underneath the nozzle that would not be cleaned as easily in a similar timeframe by a more diffuse flow. Additionally, targeted cleaning of specific regions of the substrate may be practiced, since the spot cleaning profile of the collimated flow can be modified to a precise size. This method of cleaning can also remove particles embedded in patterns more effectively because of the improved line-of-sight.

Principles of the present invention are beneficially incorporated into the ANTARES-Nano, and ARCTURUS cryogenic tools available from TEL FSI, Inc., Chaska, Minn. These principles can be incorporated into new tools or retrofit into existing tools.

In one aspect, the present invention relates to a system for treating a microelectronic workpiece with a treatment spray. The system includes a vacuum process chamber comprising a workpiece holder on which the microelectronic workpiece is positioned during a treatment, wherein the vacuum process chamber comprises a controllable vacuum pressure. The system also includes an auxiliary chamber that is in fluid communication with the vacuum process chamber in a manner such that a fluid treatment beam dispensed from the auxiliary chamber into the vacuum process chamber is aimed onto the microelectronic workpiece positioned on the workpiece holder, wherein the fluid treatment beam dispensed into the vacuum process chamber comprises a beam size that is adjustable in response to pressure changes in the vacuum process chamber such that the beam size can be adjusted on demand by adjusting the controllable vacuum pressure. The system also includes at least one nozzle that is in fluid communication with the auxiliary chamber such that the nozzle dispenses a fluid spray into the auxiliary chamber in a manner such that the fluid spray dispensed from the nozzle is confined and shaped into a shaped fluid beam in the auxiliary chamber prior to being dispensed from the auxiliary chamber as the fluid treatment beam into the vacuum process chamber. In some embodiments, the process chamber comprises a ceiling overlying the workpiece, wherein the ceiling of the process chamber is positioned in a manner effective to provide a gap between the ceiling and the substrate that helps to cause the treatment beam to flow radially outward across the microelectronic workpiece. In some embodiments, the system further includes a control system comprising program instructions that controllably collimates the beam size of the fluid treatment beam by one or more process control steps comprising controlling the vacuum pressure in the vacuum process chamber.

In another aspect, the present invention relates to a system for treating a microelectronic workpiece with a treatment spray. The system includes a vacuum process chamber comprising a workpiece holder on which the microelectronic workpiece is positioned during a treatment, wherein the vacuum process chamber comprises a controllable vacuum pressure. The system also includes a nozzle system that delivers a fluid treatment beam into the vacuum process chamber and onto the microelectronic workpiece, said nozzle system comprising (i) an auxiliary chamber in fluid communication with the vacuum process chamber and (ii) at least one nozzle housed and recessed in the auxiliary chamber. The nozzle is fluidly coupled to a fluid supply system comprising a pressurized and cooled fluid, said nozzle spraying the pressurized and cooled fluid into the auxiliary chamber. The fluid spray dispensed into the auxiliary chamber is confined and shaped into a shaped fluid beam in the auxiliary chamber. The auxiliary chamber is in fluid communication with the vacuum process chamber and is positioned over the workpiece holder in a manner such that the shaped fluid beam is dispensed from the auxiliary chamber into the vacuum process chamber as a fluid treatment beam that is aimed onto the microelectronic workpiece positioned on the workpiece holder, wherein the fluid treatment beam dispensed into the vacuum process chamber comprises a beam size that is adjustable in response to pressure changes in the vacuum process chamber such that the beam size can be adjusted on demand by adjusting the controllable vacuum pressure. In some embodiments, the process chamber comprises a ceiling overlying the workpiece, wherein the ceiling of the process chamber is positioned in a manner effective to provide a gap between the ceiling and the substrate that helps to cause the treatment beam to flow radially outward across the microelectronic workpiece.

In another aspect, the present invention relates to a method of treating a microelectronic workpiece with a treatment fluid. A microelectronic workpiece is provided, wherein the microelectronic workpiece is supported on a workpiece holder in a vacuum process chamber, wherein the vacuum process chamber has a controllable vacuum pressure. A pressurized and cooled fluid is sprayed through a nozzle into an auxiliary chamber having a sidewall and a cover, wherein the nozzle comprises at least one nozzle orifice that is recessed inside the auxiliary chamber by a recess distance relative to an auxiliary chamber outlet that opens into the vacuum process chamber, and wherein the nozzle orifice is recessed from the sidewall and the cover of the auxiliary chamber. The sprayed pressurized and cooled fluid is shaped in the auxiliary chamber to provide a shaped fluid beam. The shaped fluid beam is dispensed from the auxiliary chamber into the vacuum process chamber and onto the microelectronic workpiece as a dispensed fluid treatment beam having a beam size, wherein the beam size is adjusted by pressure changes in the vacuum process chamber such that the beam size can be adjusted on demand by adjusting the controllable vacuum pressure. In some embodiments, a control system is provided that varies the controllable vacuum pressure to maintain or adjust the beam size of the fluid treatment beam. In some embodiments, the process chamber comprises a ceiling overlying the workpiece, and the ceiling is positioned sufficiently close to the substrate to provide a gap between the ceiling and the substrate that helps to cause the treatment beam to flow radially outward across the microelectronic workpiece.

In another aspect, the present invention relates to a method of treating a microelectronic workpiece with a treatment fluid. A microelectronic workpiece is provided, wherein the microelectronic workpiece is supported on a holder in a vacuum process chamber, and wherein the vacuum process chamber has a controllable vacuum pressure. An auxiliary chamber is provided that is in fluid communication with the vacuum process chamber via at least one auxiliary chamber outlet above the microelectronic workpiece. A pressurized and cooled fluid is sprayed into the auxiliary chamber from a nozzle orifice that is recessed inside the auxiliary chamber from the auxiliary outlet, a sidewall of the auxiliary chamber, and a cover of the auxiliary chamber. The sprayed fluid dispensed into the auxiliary chamber is used to form a fluid treatment beam having a beam size, wherein the beam size is adjusted by pressure changes in the vacuum process chamber such that the beam size can be adjusted on demand by adjusting the controllable vacuum pressure. The fluid treatment beam is dispensed from the auxiliary chamber onto the microelectronic workpiece.

In another aspect, the present invention relates to a system for treating a microelectronic workpiece with a treatment spray. The system includes a housing defining a vacuum process chamber, said vacuum process chamber comprising a workpiece holder on which the microelectronic workpiece is positioned during a treatment, and wherein the housing comprises a cover structure. The system also includes an auxiliary chamber fluidly coupled to the vacuum process chamber through an auxiliary chamber outlet in the cover structure that provides an egress from the auxiliary chamber into the vacuum process chamber, wherein the footprint of the auxiliary chamber outlet is smaller than the footprint of the microelectronic workpiece. The system also includes a fluid supply system comprising one or more fluids. The system also includes at least one spray nozzle, wherein the spray nozzle is coupled to the fluid supply system in a manner effective to dispense the one or more fluids as a fluid spray, and wherein the spray nozzle is recessed in the auxiliary chamber such that the fluid spray is dispensed into the auxiliary chamber and then is dispensed from the auxiliary chamber onto the microelectronic workpiece in the vacuum process chamber.

In another aspect, the present invention relates to a system for treating a microelectronic workpiece with a treatment spray. The system comprises a vacuum process chamber comprising a workpiece holder on which the microelectronic workpiece is positioned during a treatment, wherein the vacuum process chamber comprises a controllable vacuum pressure. The system also comprises an auxiliary chamber that is in fluid communication with the vacuum process chamber and that has an outlet overlying the workpiece during the treatment. The system also comprises at least one nozzle having a nozzle outlet orifice that opens into the vacuum process chamber and positioned so that the outlet of the auxiliary chamber overlies the nozzle outlet orifice when the treatment spray is dispensed from the nozzle outlet orifice to treat the workpiece.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

DETAILED DESCRIPTION

Figure 1:
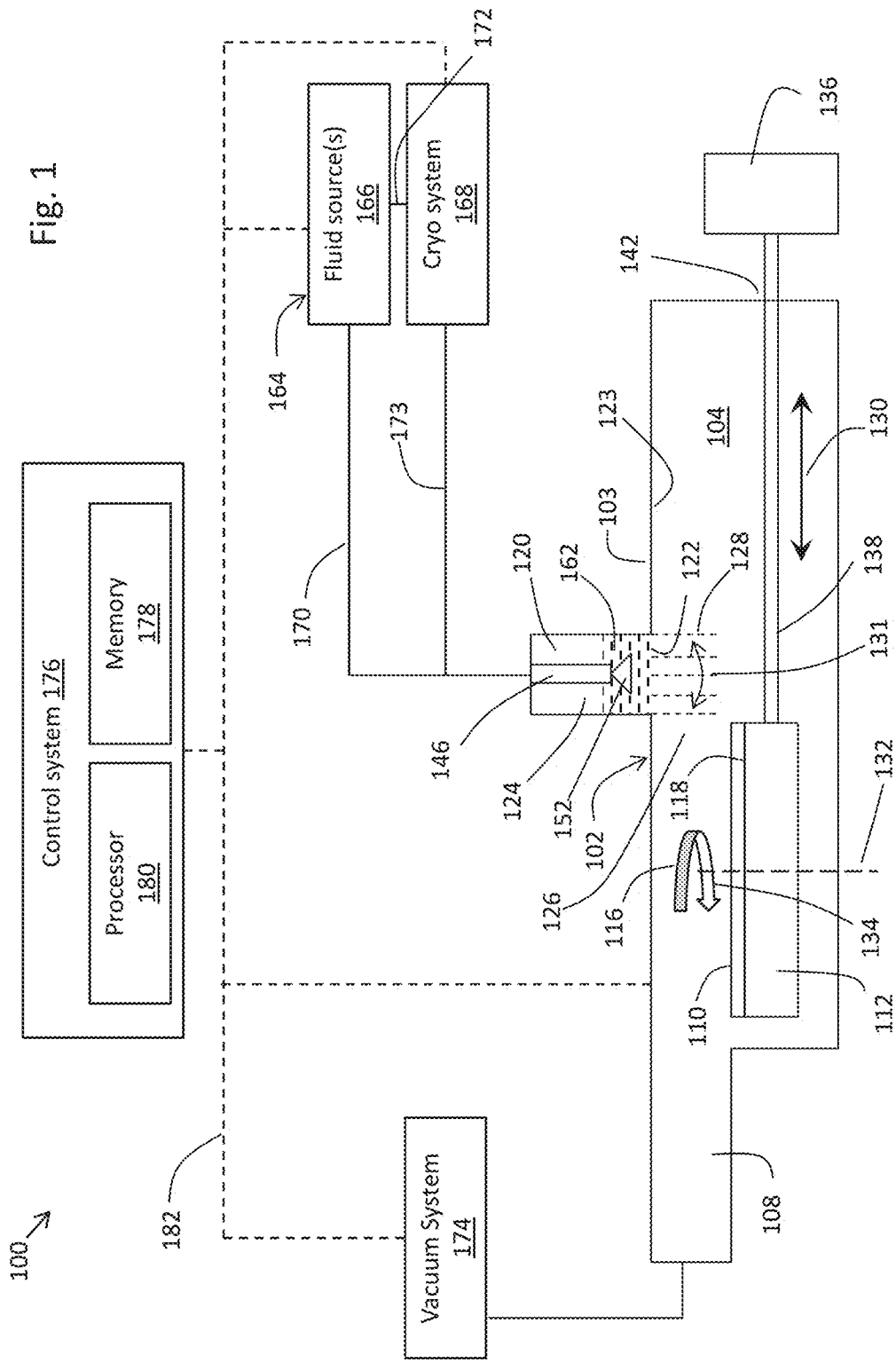
FIG. 1 includes a schematic illustration of an apparatus according to the present invention in which the apparatus includes an auxiliary chamber in fluid communication with a process chamber, and wherein a nozzle is mounted in the auxiliary chamber.

The embodiments of the present invention described below are not intended to be exhaustive or to limit the invention to the precise forms disclosed in the following detailed description. Rather a purpose of the embodiments chosen and described is so that the appreciation and understanding by others skilled in the art of the principles and practices of the present invention can be facilitated.

The principles of the present invention may be used in any microelectronic treatment or fabrication system in which a microelectronic substrate is supported on a rotating chuck in a vacuum process chamber during the course of one or more treatments. The principles of the present invention allow the beam size of a treatment spray to be easily controlled so that the beam can be more concentrated (i.e., the beam size is reduced so that the energy of the treatment spray is concentrated onto a smaller area of a workpiece) or more diffuse (i.e., the beam size is increased so that the energy of the treatment spray is distributed over a larger area of a workpiece), as desired. Such beam modulation may be used to optimize treatment results among different treatments. Beam size also may be modulated during the course of a particular treatment in order to achieve different treatment effects as the particular treatment proceeds.

In some embodiments, the principles of the present invention are incorporated into cryogenic cleaning tools such as the ANTARES® cryogenic cleaning tools commercially available from TEL FSI, Inc., Chaska, Minn. These tools implement cleaning treatments that use translatable chucks to scan substrate surfaces through one or more treatment streams. Features of the present invention that allow the beam size of a treatment spray to be modulated can be retrofit into existing ANTARES® or other tools or incorporated into new tools.

Cryogenic treatments generally involve the practice of generating treatment streams from fluid (gas, liquid, and/or solid particle streams) feed streams. The feed streams typically are pressurized and optionally cooled. When expanded through one or more suitable nozzles, the pressure release further cools the material. The resultant streams may be in the form of aerosol sprays, gas jet sprays, gas clusters, or the like. The cryogenic treatment stream dislodges contaminants on microelectronic substrate surfaces at least in part by imparting sufficient energy to overcome the adhesive forces between the contaminants and the microelectronic substrate. Hence, producing such treatment streams (e.g., aerosol sprays and/or gas cluster jet sprays in some embodiments) of the right energy may be desirable. The energy of the treatment spray, which correlates to cleaning power, is a function of factors including the mass, velocity, and/or energy density of the stream constituents. The energy may be increased by increasing velocity or mass. The energy of the beam per unit area or unit volume can be concentrated or rendered more diffuse by adjusting the beam size of the treatment spray. Increasing energy and/or energy per unit area may be important to overcome strong adhesive forces between contaminants and the surface of the substrate, including both larger contaminants and even when the contaminants are smaller (<100 nm). A more diffuse and/or less energetic beam may be desirable to treat larger particles and/or to avoid damaging sensitive features.

In one mode of practice, a treatment may involve modulating beam size during a treatment in order to optimize and remove particles of different sizes. For example, a first treatment portion may occur with a relatively large beam size that may be effective to remove larger particles, e.g., those greater than 100 nm in size. A second treatment portion may be carried out before or after the first treatment portion using a more concentrated beam which may tend to be more effective to remove smaller contaminants, e.g., those under 100 nm in size. These treatments may be repeated through one or more additional cycles, if desired. Additionally, at least one additional treatment portion may be integrated into the treatment at higher, lower, or intermediate energies or beam sizes in order to optimize removal of other kinds of particles or particle sizes.

Referring to FIGS. 1 to 4, the principles of the present invention will be illustrated by an apparatus in the form of cryogenic treatment system 100. System 100 includes housing 102 that is configured to provide a vacuum process chamber 104 and an auxiliary chamber 120 that opens into vacuum process chamber 104. Housing 102 also is configured to provide an exhaust plenum 108 through which fluids are withdrawn from process chamber 104. Vacuum process chamber may be operated to establish a vacuum environment during at least a portion of one or more treatments. The vacuum pressure is controllable so that it can be maintained, increased, decreased, and/or modulated according to a vacuum pressure profile as a function of time, or otherwise adjusted as desired. In representative modes of practice, a vacuum established in process chamber may be in a range from 1 milliTorr to 750 Torr. Often, the pressure is under 50 Torr or even under 25 Torr to enhance the formation of a treatment beam 128 comprising an aerosol and/or gas clusters.

Generally, the ambient pressure in auxiliary chamber 120 closely matches the pressure in chamber 104 in view of the open communication between the chambers provided by auxiliary outlet 122. Hence, when a vacuum environment is established in chamber 104, a similar vacuum environment also is established in auxiliary chamber 120.

Substrate 110 is held on workpiece holder in the form of a rotatable and translatable chuck 112 inside vacuum process chamber 104. Substrate 110 is held by the movable chuck 112 while substrate 110 is translated and/or rotated during at least a portion of one or more treatments. Auxiliary chamber 120 is integrated into the cover portion 103 of housing 102 so that auxiliary chamber 120 opens via auxiliary outlet 122 into the headspace 124 above the substrate 110. As illustrated, the footprint of the auxiliary chamber outlet 122 is smaller than the footprint of the substrate 110. As a result, substrate 110 can be scanned past the outlet 122 as substrate 110 rotates and/or translates. Auxiliary chamber 120 is in fluid communication with vacuum process chamber 104 through outlet 122 incorporated into chamber ceiling 123. Chamber ceiling 123 may be fixed in location with respect to the process chamber 104 or it may be moveable such is ceiling 123 were incorporated into a chamber lid that could be opened or closed to gain access to process chamber 104. Treatment beam 128 emanates from auxiliary chamber 120 to impact the substrate 110. In a cryogenic treatment, the impact dislodges and helps remove contaminants from the substrate 110.

This configuration provides a gap 126 (see FIG. 4) between ceiling 123 and the substrate 110. The proximity between ceiling 123 and substrate 110 provided by gap 126 contributes to cleaning performance by helping to create a radial cleaning effect relative to the initial downward path of treatment beam 128. The treatment beam 128 has a tendency to first flow downward into chamber 104 and then secondly to flow radially outward across the surface of substrate 110 relative to this initial downward path. The result is that the overall cleaning footprint on the substrate 110 is wider than the size of the treatment beam 128 emitted from the auxiliary chamber 120. The combination of the downward and radial action also helps to improve cleaning performance. In contrast, if gap 126 were too large, the radial cleaning action would be reduced or even absent.

The size of this gap 126, i.e., the distance between ceiling 123 and substrate 110 can be a variety of suitable distances and even may be adjustable during the course of a particular treatment or among different treatments to adjust the desired degree of radial cleaning action. If the distance is too small, it may be more difficult to modulate the size of a treatment beam 128 using principles of the present invention. If the distance is too great, lesser radial cleaning action may result than might be desired. Additionally, more energy than desired may be lost by the beam 128 before beam 128 impacts substrate 110. Balancing these concerns, a suitable gap size for gap 126 is in the range from 10 mm to 200 mm, preferably 20 mm to 100 mm, more preferably 30 mm to 75 mm.

Rotatable and translatable chuck 112 may include gripping and/or supporting features (not shown) to help secure substrate 110 on chuck 112. The substrate 110 may be held on chuck 112 using a wide variety of such gripping and/or supporting features such as any of the commonly practiced techniques within the field of semiconductor processing. These may include, but are not limited to, mechanical fasteners or clamps, vacuum clamping, gripping fingers, rest pads, electrostatic clamping, combinations of these, and the like. Illustrative embodiments of substrate holding features are described further below. Further, the chuck 112 may include lift pins, actuation pins, pivot arms, and the like (not shown) to help transfer the substrate 110 to and from the movable chuck 112 when the substrate 110 enters or is taken from the process chamber 104 manually or automatically via a wafer handling system (not shown).

Illustrative embodiments of rotatable and translatable chucks including such gripping and lifting features are further described in U.S. Ser. No. 15/806,760, filed: Nov. 8, 2017, titled MAGNETICALLY LEVITATED AND ROTATED CHUCK FOR PROCESSING MICROELECTRONIC SUBSTRATES IN A PROCESS CHAMBER in the names of William P. Inhofer, Sean Moore, Lance Van Elsen (now published as U.S. Pat. Pub. No. 2018/0130694), referred to herein as Co-Pending Application 1; and U.S. Ser. No. 15/824,021, filed: Nov. 28, 2017, titled TANSLATING AND ROTATING CHUCK FOR PROCESSING MICROELECTRONIC SUBSTRATES IN A PROCESS CHAMBER, in the names of Edward Deneen Hanzlik, Michael Gruenhagen, Tim W. Herbst (now published as U.S. Pat. Pub. No. 2018/0151396), referred to herein as Co-Pending Application 2. Each of Co-Pending Applications 1 and 2 is incorporated herein by reference for all purposes.

Substrate 110 is schematically shown in FIG. 1 as directly contacting upper surface 118 of chuck 112. In more preferred modes of practice, as shown in the cited Co-pending Applications 1 and 2, substrate 110 may be supported so that a small gap (not shown) is provided between substrate 110 and upper surface 118.

The rotatable and translatable chuck 112 may be translated to traverse laterally along translation pathway 130. Such translation may be along a linear and/or nonlinear path. For purposes of illustration, pathway 130 is linear. Further, the translatable and rotatable chuck 112 is configured to rotate the substrate 110 about rotation axis 132 to provide rotational degree of freedom 134. Translation and rotation may be done concurrently or individually during a treatment. Translation and rotation facilitate translational scanning of the substrate 110 underneath the auxiliary chamber outlet 122 and through treatment beam 128.

Treatment beam 128 has a beam width 131. In the practice of the present invention, the beam width 131 can be easily adjusted on demand simply by changing the pressure in vacuum process chamber 104. Increasing the chamber pressure tends to provide a smaller, more concentrated beam width 131. A smaller beam has more energy per unit volume and tends to be more effective to remove smaller particles, e.g., particles under 100 nm in size. Lowering the chamber pressure tends to provide a larger, less concentrated beam width 131. A larger beam has less energy per unit volume and may tend to be effective to remove larger particles, to clean larger areas per unit time, and/or pose more risk of damaging sensitive features on substrate 110.

Figure 2:
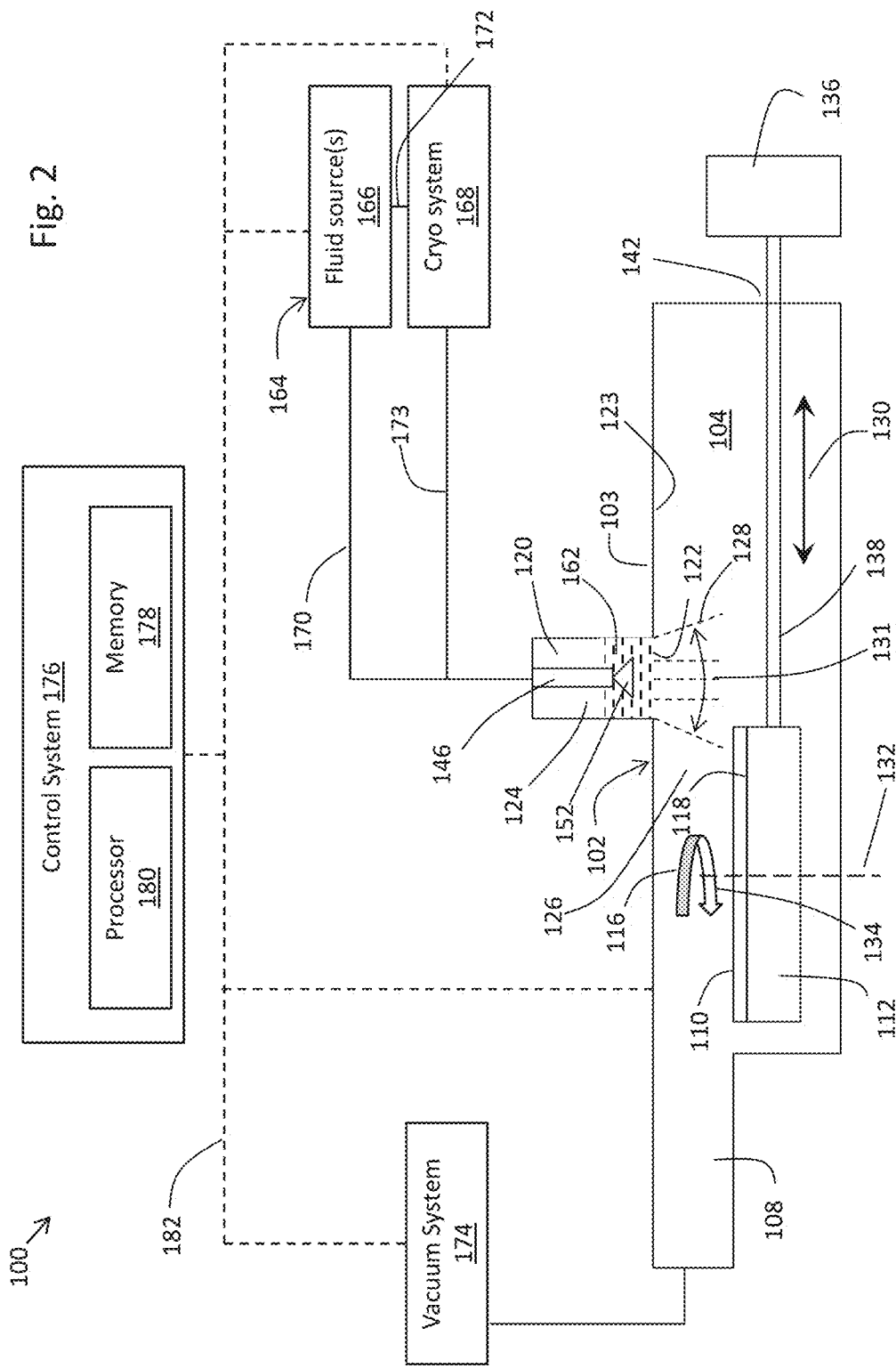
FIG. 2 shows the apparatus of FIG. 1 in which the pressure in the process vacuum process chamber is lower, resulting in a wider, more diffuse treatment beam.
Figure 3:
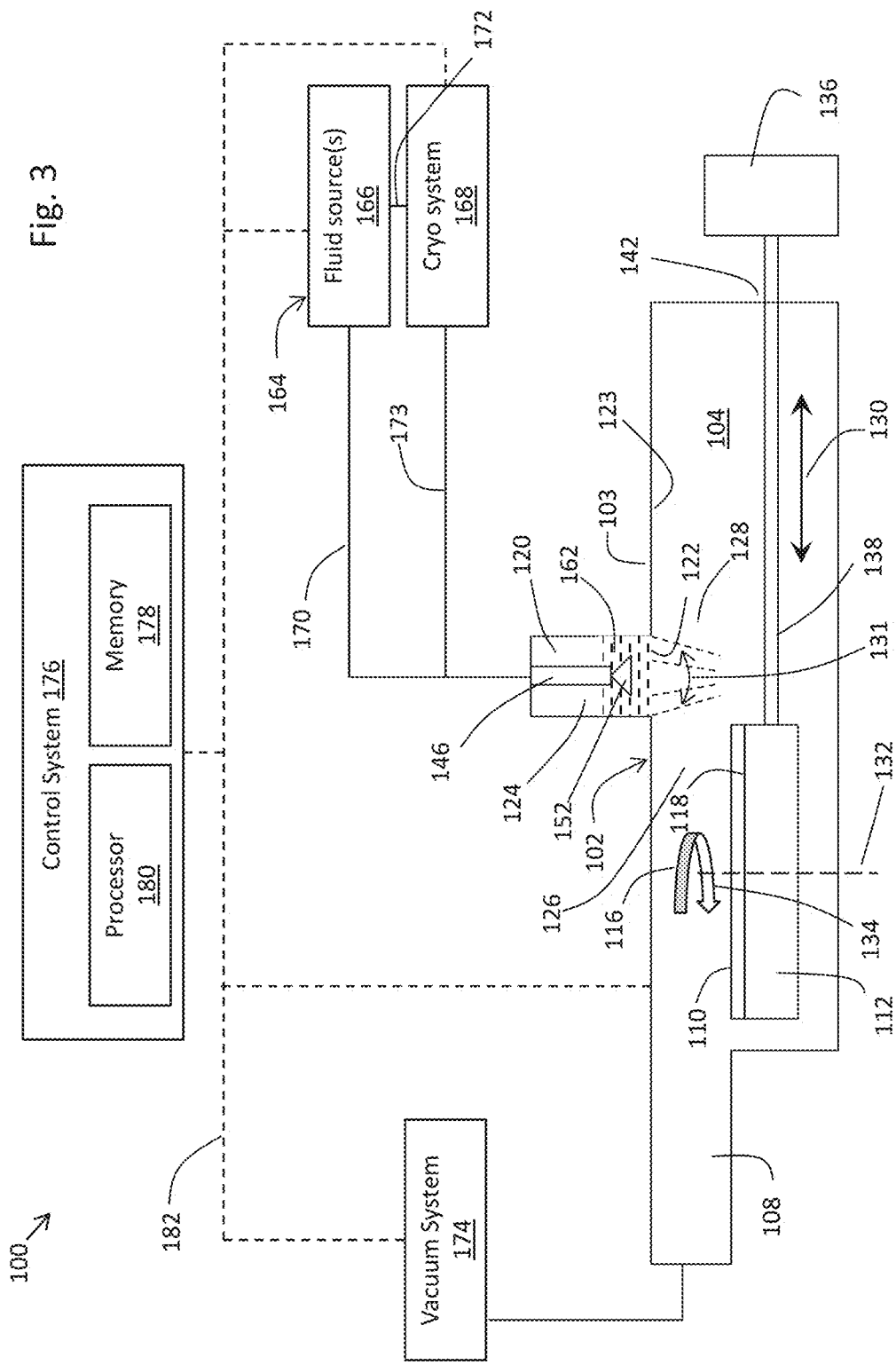
FIG. 3 shows the apparatus of FIG. 1 in which the pressure in the vacuum process chamber is higher, resulting in a smaller, more focused treatment beam.

FIGS. 1, 2 and 3 schematically illustrate the correlation between chamber pressure and beam width 131 for apparatus 100. In all three Figures, apparatus 100 is the same except that the chamber pressure differs in each. For example, FIG. 1 shows treatment beam 128 as having beam width 131 when the chamber is at a certain chamber pressure, such as 12 Torr by way of example. FIG. 3 shows an alternative embodiment of treatment beam 128 in which the chamber pressure is increased, such as to 19 Torr by way of example. As a result of the higher chamber pressure, beam width 131 is smaller in FIG. 3. FIG. 2 shows a further alternative embodiment of treatment beam 128 in which the chamber pressure is lowered relative to the chamber pressure in FIGS. 1 and 3, such as to 4 Torr by way of example. As a result of the lower pressure, beam width 131 is wider.

Rotatable and translatable chuck 112 is attached to translation mechanism 136. Translation mechanism 136 is coupled to the chuck 112 in a manner effective to translate the moveable chuck 112 along a translation pathway 130 underneath the outlet 122, to allow the microelectronic substrate 110 to be moved through the treatment beam 128 dispensed from the auxiliary chamber 120. In practical effect, translation of chuck 112 helps treatment beam 128 scan across substrate 110 as substrate 110 rotates and/or translates. Translation can be distinguished from rotation in that translation of chuck 112 causes the rotation axis 132 of chuck 112 to move from one location in chamber 104 to another location. In rotation, the relative position between rotation axis 132 and chuck 112 does not change even as chuck 112 translates within chamber 110. Translation mechanism 136 is coupled to chuck 112 by translation rods 138. Consequently, actuation of translation mechanism 136 causes corresponding translation of chuck 112.

One or more translation rods 138 include portions both inside and outside process chamber 104. Successive portions of rods 138 enter or leave the protected enclosure of chamber 104 (which often is a vacuum enclosure in the case of cryogenic treatments) provided by chamber 104 as the rods 138 are actuated to translate back and forth. A seal interface provides an environmentally tight seal at the housing egress 142 for rods 138 to help maintain the protected environment, e.g., vacuum, inside chamber 104 during this translation.

The translation mechanism 136 may comprise any electrical, mechanical, electromechanical, hydraulic, or pneumatic device to allow actuation of rods 138. The translation mechanism 136 may be designed to provide a range of motion sufficient to permit desired translation of the microelectronic substrate 110 to facility loading, unloading, and treatment operations. For example, during at treatment, substrate 110 is scanned at least partly through the area of treatment beam 108 emanating from the auxiliary chamber 120. During treatments, the substrate 110 can be translated and/or rotated through beam 128 across a portion or the entire diameter of the substrate 110 at a suitable rate, such as up to 300 mm/sec, such that the nozzle 105 scans the desired portions of the substrate 110.

Treatment spray 152 is dispensed into auxiliary chamber 120 through one or more suitable nozzles. For purposes of illustration, a single nozzle 146 is mounted in auxiliary chamber 120. Details of nozzle 146 are shown schematically in FIGS. 1 to 3 and in more detail in FIG. 4. Nozzle 146 extends from a first end 148 to second end 150. First end 148 is fluidly coupled to a fluid supply system 164 comprising one or more fluid sources 166. At least one of the fluid sources 166 comprises a pressurized and cooled fluid. Nozzle 146 includes one or more orifices through which treatment spray(s) are dispensed. For purpose of illustration, second end 150 includes a single nozzle orifice 151 through which one or more fluids obtained from a fluid system 164 are dispensed from nozzle 146 as treatment spray 152 into auxiliary chamber 120.

Figure 4:
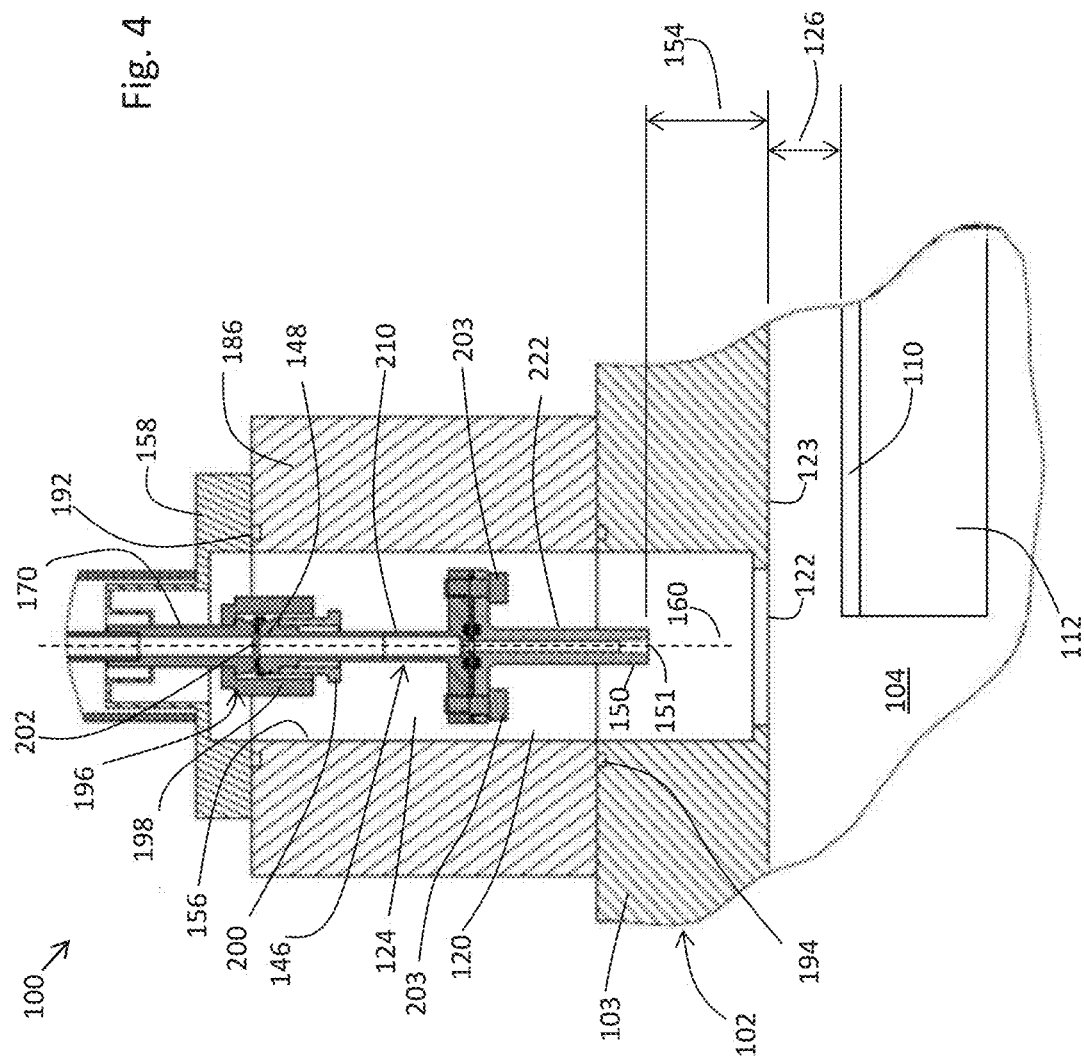
FIG. 4 is a side cross-section of a portion of the apparatus of FIG. 1 showing the auxiliary chamber and nozzle in more detail.

Second end 150 of nozzle 146 is recessed within auxiliary chamber 120 by a suitable recess distance 154 (See FIG. 4). Additionally, the nozzle orifice(s) also are recessed from the sidewalls 156 and cover 158 of auxiliary chamber 120 to create headspace 124 below, to the sides, and above the nozzle orifice(s). In preferred embodiments, auxiliary chamber 120 comprises a cylindrical geometry, and nozzle 146 is deployed on the central axis 160 (see FIG. 4) of chamber 120. This symmetrical and recessed nozzle deployment helps to ensure that treatment spray 152 is first dispensed into auxiliary chamber 120. Because auxiliary chamber 120 is in open fluid communication with process chamber 104, treatment spray 152 is dispensed from auxiliary chamber 120 into process chamber 104 as treatment beam 128 that is aimed onto the substrate 110 held on chuck 112. Advantageously, the treatment beam 128 has a beam size or width 131 that is adjusted by pressure changes in the chamber 104 such that the beam size or width 131 can be adjusted on demand by adjusting the controllable vacuum pressure of chamber 104.

Without wishing to be bound by theory, it also is believed that the symmetrical and recessed nozzle deployment with auxiliary chamber 120 helps to ensure that treatment spray is uniformly shaped and expanded to a limited degree within the limited volume provided by auxiliary chamber 120 before being dispensed into process chamber 104 as treatment beam 128. This shaping effect is schematically shown as shaped stream 162 that at least partially fills the auxiliary chamber 120. This effect helps to provide a well-defined treatment beam 128 whose size can be easily and accurately adjusted on demand simply by adjusting chamber pressure. The ability to create such a well-shaped and controllable treatment beam 128 would be reduced if treatment spray 152 were to be dispensed directly into process chamber 104 in the headspace 124 above substrate 110.

Mounting of nozzle 146 in auxiliary chamber 120 provides even more advantages. A first additional advantage relates to the effectiveness of cryogenic cleaning in a heated process chamber. In some modes of practice, one or more aspects of the processing environment may be heated. Such aspects include heating one or more of the chamber cover portion 103, the chuck 112, walls of auxiliary chamber 120, and/or the like. A conventional expectation would be that heating one or more of these components, such as the walls of auxiliary chamber 120, would suppress cryogenic cleaning performance. In the practice of the present invention where the treatment spray 152 is shaped into treatment beam 128 by the auxiliary chamber 120, such suppression is greatly reduced and in some instances has not been observed.

An additional key advantage relates to cleaning performance. The on-substrate pattern of treatment beam 128 is more uniform and more effective as evidence in part by more cleaning occurring within the treatment beam 128. Lateral cleaning outside the main beam is less pronounced. This means that the beam energy is concentrated or focused into a more well-defined area. Because the energy is more focused into a well-defined area, this would offer the benefit to remove smaller particles because beam power per unit area is higher.

Nozzle 146 is configured to expand and cool the fluid stream as it is dispensed as spray 152 into the auxiliary chamber 120. When the pressurized and cooled fluid stream is dispensed into the low pressure environment of auxiliary chamber 120 from nozzle 146, the supplied pressurized and cooled fluid tend to be converted into an energetic stream comprising gas clusters, liquid particles, and/or solid particles. This transformation occurs due to the substantial cooling effect that occurs when a pressurized and cooled fluid is dispensed into a much lower pressure environment. These particles ultimately form treatment beam 128 to collide with contaminants on the substrate 110. The collision tends to dislodge the contaminants, allowing them to be withdrawn from the substrate 110 and process chamber 104 through exhaust plenum 108. The contaminant removal is very effective to clean the substrate 110 to meet standards in the fabrication of devices in the microelectronic industry.

Treatment spray 152, shaped beam 162, and/or treatment beam 128 may be in the form of cryogenic aerosols, cryogenic aerosol jets, nano-aerosol sprays, gas jet clusters, and the like in illustrative embodiments. However, the present invention disclosed herein is not intended to be limited to cryogenic treatment equipment, which is done for explanatory purposes only. The principles of the present invention may be incorporated into any other systems where a workpiece such as substrate 110 is treated in a vacuum process chamber. The system 100 illustrates an exemplary implementation of the present invention within the cryogenic treatment context where temperature, pressure, gas flow rates, and many other process conditions are controlled to treat substrates as a demonstration of the many capabilities of the present invention to meet a variety of demanding performance criteria.

Nozzle 105 receives a fluid stream (e.g., a flow of one or more gases and/or one or more liquids) from a fluid supply system 164 comprising one or more fluid supply sources 166 coupled to nozzle 105 by supply line 170. Optionally, the fluid supply system 164 may further incorporate a cooling system 168 to cool the fluid(s) to a desired temperature prior to being expanded through nozzle 146 and dispensed into the auxiliary chamber 120. Fluid is supplied from fluid source(s) 166 to cooling system 168 by line 172. The cooled fluid is supplied from cooling system 168 to supply line 170 via line 173.

In illustrative embodiments, at least one fluid supplied to nozzle 146 from fluid system 164 may be supplied at pressures in the range from 10 psig to 900 psig, preferably 10 psig to 500 psig, more preferably 10 psig to 100 psig. The temperature of the fluid may be in the range from 50 K to 320 K, preferably 70 K to 320 K, more preferably 70 K to 150 K. So long as the fluid stream can flow and be dispensed into the chambers 104 and 106, some modes of practice may involve supplying fluids with gas, liquid, and/or entrained solid material. Preferably, the fluid is supplied at pressure and temperatures such that the fluid comprises a gas and/or a liquid. In some modes of practice, the pressurized and cooled fluid may be supplied to nozzle 146 such at at least 99 weight percent of the pressurized and cooled fluid is a gas. In other modes of practice, the pressurized and cooled fluid may be supplies to nozzle 146 such that at least ten weight percent of the fluid is liquid and less than 1 weight percent, more preferably less than 0.1 weight percent, is in a solid phase. Fluid supply source(s) 166 may comprise one or more pressurized and cooled fluids. Such fluids may be gases and/or liquids. Preferably, the pressurized and cooled fluids comprise at least one gas. Examples of suitable gases or liquids include one or more of nitrogen, argon, He, hydrogen, Xe, $CO_2$, neon, krypton, combinations of these, and the like. In one embodiment, the pressurized and cooled gas or liquid is argon. In another embodiment, the pressurized and cooled gas or liquid is nitrogen. In another embodiment, the pressurized and cooled gas or liquid comprises nitrogen and argon at a molar ratio of argon to nitrogen in the range from 1:100 to 100:1, preferably 1:20 to 20:1, more preferably 1:10 to 10:1.

In those embodiments comprising carbon dioxide, nitrogen and/or argon, the fluid may further comprise one or more additional gases or liquids as well. In one embodiment, the additional gas or liquids comprise helium, hydrogen, neon, or a combination of these wherein the molar ratio of the total amount of the additional gas(es) to the argon, carbon dioxide and/or nitrogen is in the range from 1:100 to 100:1, preferably 1:1 to 10:1. Specific mixtures include argon and helium; argon and hydrogen; argon, hydrogen, and helium; nitrogen and helium; nitrogen and hydrogen; nitrogen, hydrogen, and helium; carbon dioxide and helium; carbon dioxide and hydrogen; and carbon dioxide, hydrogen, and helium.

Treatment materials dispensed into chamber 110 may be evacuated using vacuum system 174. Vacuum system 174 also may be used to establish and to maintain processing chamber 104 at an appropriate sub-atmospheric, process pressure. The vacuum system 174 may include one or more pumps to enable vacuum pressures to a desired level.

A control system 176 (which may include one or more integrated control devices) may be used to monitor, receive, and/or store process information. For example, control system 176 may include a memory 178 to store process recipes, command structures, user interfaces, real time process information, historical process information, feed supply, temperature control, pressure control, heating control, chuck levitation and rotation, chuck translation, substrate loading and unloading, substrate securement on the chuck 112, process control feedback, and the like. Control system 176 may use a computer processor 180 to implement these operations and to receive and issue instructions and other signals over a network 182 that interfaces with the other components of system 100.

FIG. 4 shows the auxiliary chamber and nozzle of apparatus 100 in more detail. Housing 102 includes features to integrate auxiliary chamber 120 into cover portion 103 of housing 102. These components include chamber body 186 and chamber cover 158. Chamber body 186 includes cylindrical through bore to provide auxiliary chamber 120 with a cylindrical geometry. Chamber body 186 also serves as a spacer block to help provide a desired recess distance 154 between the nozzle orifice 151 of nozzle 146 and the outlet 122 of auxiliary chamber 120. Using a taller chamber body 186 causes recess distance 154 to be larger, while using a shorter chamber body 186 causes recess distance 154 to be smaller. Accordingly, selecting an appropriate length for chamber body 186 provides a way to adjust the total distance between the nozzle orifice 151 and the substrate 110.

Upper seal 192 helps to provide an environmentally tight interface between cylindrical body 186 and cover 158. Lower seal 194 helps to provide an environmentally tight interface between cylindrical body 186 and lid cover portion 103.

Supply line 170 (see FIGS. 1-3 and FIG. 4) in this illustrative embodiment is shown as a vacuum jacketed conduit. This configuration helps to keep the pressurized and cooled fluid cool as it is supplied to the nozzle 146. Supply line 170 is connected to nozzle by coupling member 196. Coupling member 196 includes female component 198 and male component 200 that threadably engage to clamp the nozzle 146 to the end of supply line 170. A gasket 202 may be used to help provide an environmentally tight seal between nozzle 146 and supply line 170.

For a given nozzle 146, a taller chamber body 186 generally provides a deeper (greater) recess distance, while a shorter chamber body 186 generally provides a shallower (smaller) recess distance. A wide range of recess distances may be used in the practice of the present invention. In illustrative embodiments, recess distance 154 may be in the range from 5 mm to 200 mm, preferably 10 mm to 50 mm. In a specific embodiment, a recess distance of 23.5 mm was found to be suitable.

Nozzle 146 includes a first body 210 and a second body 222. First body 210 is connected to supply line 170. Second body 222 is removably attached to first body 210 and includes orifice 151 through which pressurized and cooled fluid is dispensed to provide treatment spray 152 (shown in FIGS. 1-3). In this embodiment, machine screws 203 are used to attach second body 222 to first body 210. Second body 222 is easily removed and replaced, if desired, with alternative second bodies in order to provide different nozzle outlet shapes and sizes in coordination with different treatments.

Figure 9:
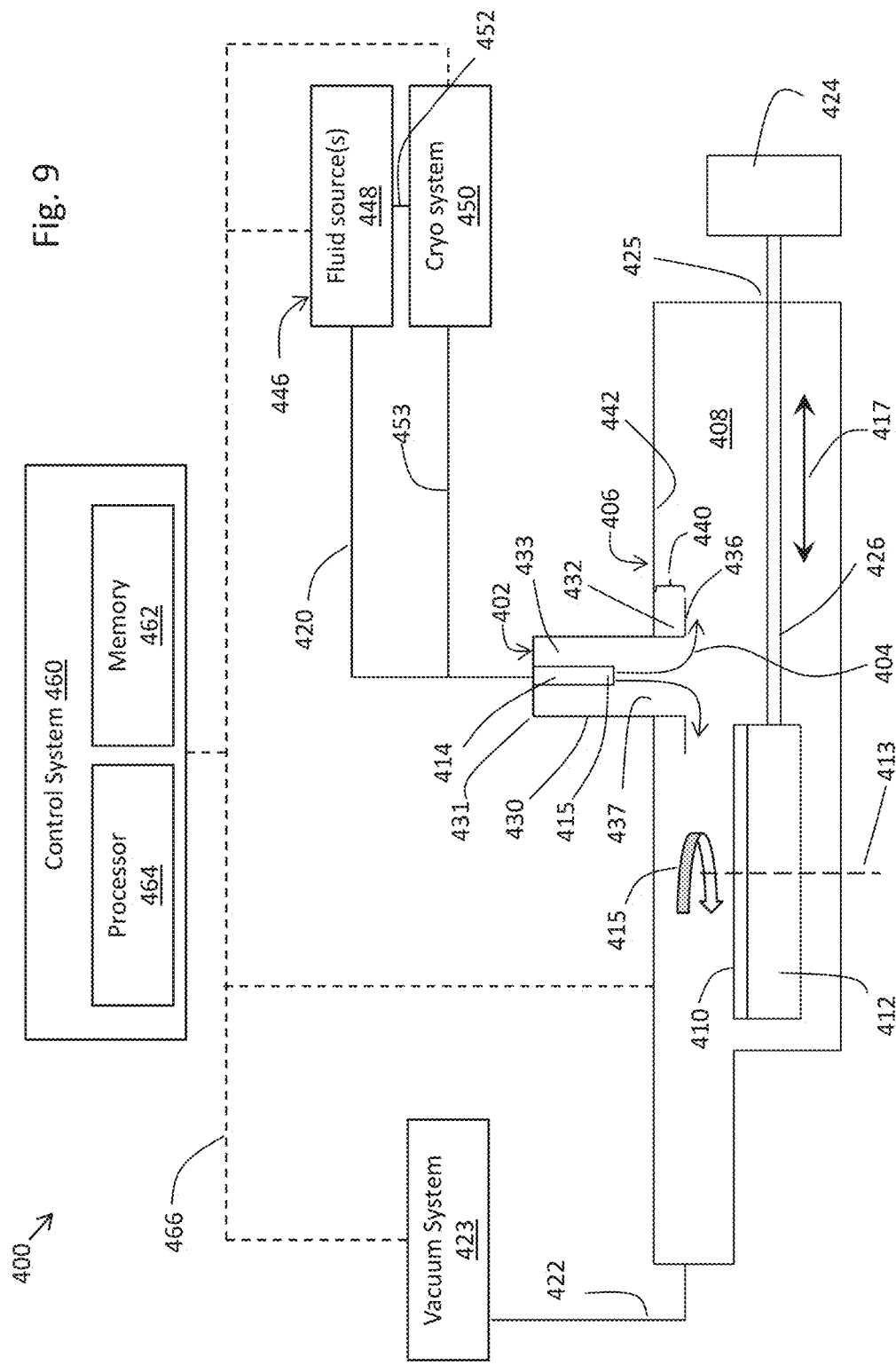
FIG. 9 shows an alternative embodiment of an apparatus of the present invention that includes an alternative deployment of the auxiliary chamber assembly.

FIGS. 1 through 4 illustrate an embodiment of an apparatus 100 in which the chamber ceiling 123 is generally flush with the outlet 122 of the auxiliary chamber 120. The limited spacing between ceiling 123 and the underlying substrate 110 helps to confine and guide the treatment beam (e.g., spray 152) ejected from nozzle 146. In some modes of practice, this confinement and guiding helps to promote a radial flow component of the treatment beam across the surface of the substrate 110. FIG. 9 shows an alternative embodiment of an apparatus 400 in which alternative positioning of an auxiliary chamber assembly 402 helps to provide a similar containment and guiding of a treatment beam 404 except that the configuration of the auxiliary chamber assembly 402 mainly helps to provide a similar containment and guiding function. This containment may promote a radial flow of treatment beam 404 over the surface of substrate 410 in some modes of practice.

Referring to FIG. 9, apparatus 400 shows auxiliary chamber assembly 402 fitted to process chamber housing 406 that defines process chamber 408. A workpiece in the form of microelectronic substrate 410 is supported on a rotatable and translatable chuck 412. Chuck 412 can be actuated on demand to rotate about axis 413 with a clockwise or counterclockwise rotational degree of freedom 415. In order to provide a translational degree of freedom 417 in at least two translatable directions, rotatable and translatable chuck 412 is attached to translation mechanism 424. Translation mechanism 424 is coupled to the chuck 412 in a manner effective to translate the moveable chuck 412 along a translation pathway to allow the microelectronic substrate 410 to be translated through the treatment beam 404. Such a translation may be linear or non-linear. Translation mechanism 424 is coupled to chuck 412 by one or more translation arms 426 so that actuation of translation mechanism 424 causes corresponding translation of chuck 412.

Translation arm(s) 426 include portions both inside and outside process chamber 408. Successive portions of arm(s) 426 enter or leave the protected enclosure of chamber 408 (which often is a vacuum enclosure in the case of cryogenic treatments) as the arm(s) 426 are actuated to translate back and forth according to translational degree of freedom 417. A suitable seal interface provides an environmentally tight seal at the housing egress 425 to help maintain the protected environment, e.g., vacuum, inside chamber 408 during this translation.

Treatment materials dispensed into chamber 408 may be evacuated via exhaust line 422 using a suitable vacuum system 423. Such a vacuum system 423 also may be used to establish and to maintain processing chamber 408 at an appropriate sub-atmospheric, process pressure. Such a vacuum system 423 may include one or more pumps to enable vacuum pressures to a desired level.

Auxiliary chamber assembly 402 defines an auxiliary chamber 433 housing the nozzle 414. Auxiliary chamber assembly 402 includes cylindrical sidewall 430 extending from upper end 431 to lower end 432. Annular flange 436 projects radially outward from lower end 432 to provide a ceiling overlying substrate 410. Lower end 432 and flange 436, and hence the ceiling function, project downward into chamber 408 such that there is a gap 440 between flange 436 and the overlying surface 442 of the chamber housing 406. With this configuration, ceiling 438 provided by the projecting auxiliary chamber assembly 402 helps to contain and guide the flow of the treatment beam 404 onto and then over the surface of substrate 410.

Auxiliary chamber assembly 402 includes nozzle 414. Nozzle 414 is mounted to assembly 402 proximal to the upper end 431. Nozzle 414 includes nozzle outlet orifice 415 that is recessed inside auxiliary chamber 433. As a consequence of this configuration, treatment beam 404 is ejected from nozzle 414 first into auxiliary chamber 433 in which the treatment beam 404 is shaped and then is guided down into the process chamber 408 to treat the substrate 410.

Nozzle 414 receives a fluid stream (e.g., a flow of one or more gases and/or one or more liquids) from a fluid supply system 446 comprising one or more fluid supply sources 448 coupled to nozzle 414 by supply line 420. Optionally, the fluid supply system 446 may further incorporate a cooling system 450 to cool the fluid(s) to a desired temperature prior to being expanded through nozzle 414 and dispensed into the auxiliary chamber 402. Fluid is supplied from fluid source(s) 448 to cooling system 450 by line 452. Line 453 couples the cooling system to the line 420.

The fluid stream may be supplied to nozzle 414 at temperatures and pressures as described above for the fluid stream fed to nozzle 146 for apparatus 100. The fluid stream supplied to nozzle 414 may have a composition as described above with respect to the fluid stream fed to nozzle 146 for apparatus 100. The fluid stream supplied to nozzle 414 may have a gas and/or liquid content as described above with respect to the fluid stream fed to nozzle 146 for apparatus 100.

A control system 460 (which may include one or more integrated control devices) may be used to monitor, receive, and/or store process information. For example, control system 460 may include a memory 462 to store process recipes, command structures, user interfaces, real time process information, historical process information, feed supply, temperature control, pressure control, heating control, chuck levitation and rotation, chuck translation, substrate loading and unloading, substrate securement on the chuck 412, process control feedback, and the like. Control system 460 may use a computer processor 464 to implement these operations and to receive and issue instructions and other signals over a network 466 that interfaces with the other components of apparatus 400.

The operation of apparatus 400 is similar to the operation of apparatus 100 except that the projecting auxiliary chamber assembly 402 includes the flange 436 that helps to confine and guide treatment beam 404. In contrast, for apparatus 100, ceiling 123 is the surface that mainly helps to confine and guide the treatment beams used in apparatus 100.

Figure 10:
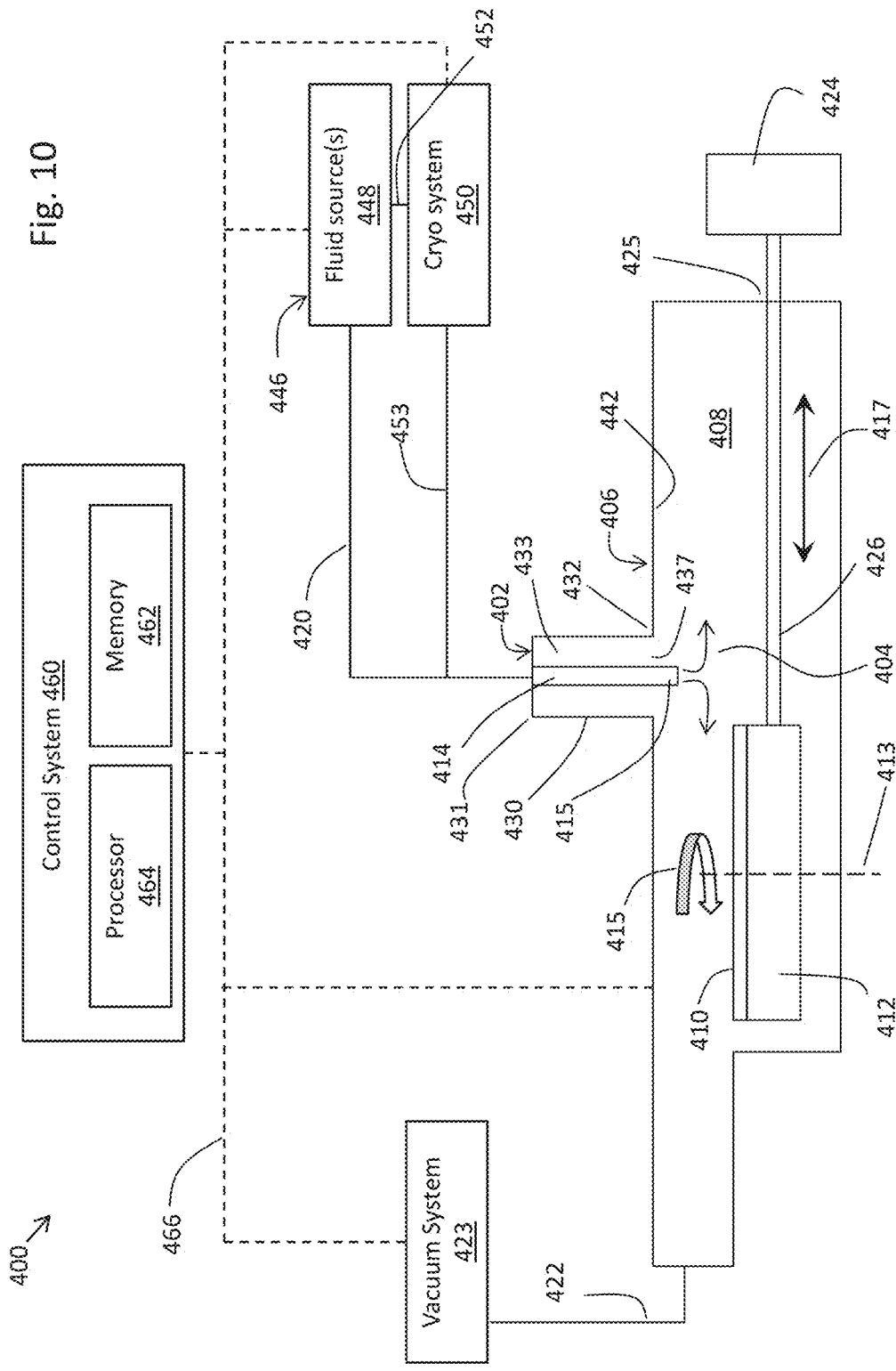
FIG. 10 shows a modification of the apparatus of FIG. 9 including an alternative auxiliary chamber assembly configuration and an alternative nozzle deployment relative to the auxiliary chamber.

FIG. 10 shows how apparatus 400 can be modified to include an alternative configuration of auxiliary chamber assembly 402. In FIG. 10, auxiliary chamber assembly 402 is incorporated into apparatus 400 so that its outlet 437 is flush with surface 442 and so that nozzle 414 is extended so that the nozzle outlet orifice 415 projects into process chamber 408. In this modification, surface 442 functions as a ceiling over the substrate 410 to help confine and guide the beam 404. Also, even though the nozzle outlet orifice 415 is not recessed inside the auxiliary chamber 433 but instead projects beyond the chamber 433 and into the process chamber 408, it is believed that the position of the auxiliary chamber 433 and outlet 437 above the nozzle outlet orifice 415 helps to shape the beam 404 responsive to pressure changes in process chamber 408.

Reference throughout this specification to "one embodiment" or "an embodiment" means that a particular feature, structure, material, or characteristic described in connection with the embodiment is included in at least one embodiment of the invention, but does not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic substrate" or "substrate" as used herein generically refers to an object or workpiece being processed in a treatment apparatus such as an apparatus in accordance with the invention, wherein such object or workpiece is intended to constitute all or a portion of a microelectronic device. The microelectronic substrate may include any material portion or structure of a device, particularly a semiconductor or other electronics device, and may, for example, be a base substrate structure, such as a semiconductor substrate or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation. In addition to microelectronic substrates, the techniques described herein may also be used to clean reticle substrates that may be used to patterning of microelectronic substrates using photolithography techniques.

The present invention will now be further described with reference to the following illustrative examples.

Example 1

Figure 5:
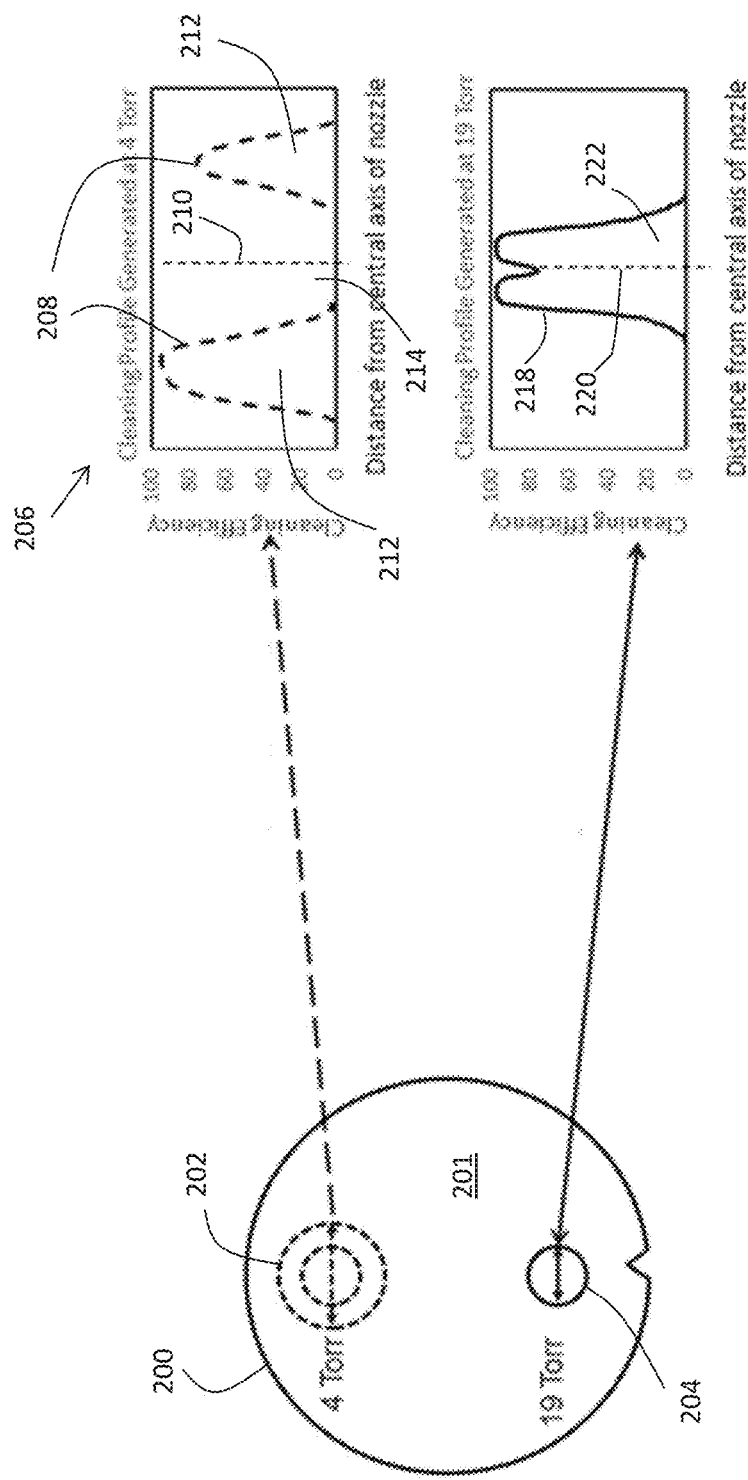
FIG. 5 schematically illustrates test results that show how adjusting pressure in the vacuum process chamber of the apparatus of FIG. 1 can be used to tune the size of the treatment beam and change its cleaning profile.

Referring to FIG. 5, tests (Tests 1 and 2) were conducted to demonstrate small particle cleaning of a 300 mm, bare silicon wafer 200 having a surface 201 contaminated with 30 nm silica particles and then exposed to cryogenic aerosol treatment beams at two different chamber pressures, respectively. A relatively more concentrated treatment beam at relative higher vacuum chamber pressure of 19 Torr was used for one test. This was compared to a larger, more diffuse treatment beam at lower chamber pressure of 4 Torr under otherwise the same conditions for a second test.

To prepare the wafer for testing, 30 nm silica particles were wet deposited onto the bare silicon wafer 200, aged for 3 hours, and then placed into a vacuum chamber in a cryogenic treatment tool according to FIG. 1 and FIG. 4. The tool was configured to have, the capability to control the chamber pressure. A nozzle was mounted in a cylindrical auxiliary chamber such that the nozzle orifice was 50 mm from the substrate. The nozzle orifice was 1.9 mm in diameter. The nozzle also was recessed 27 mm within the cylindrical auxiliary chamber. The auxiliary chamber had a diameter of 42 mm.

To conduct the tests, pressurized and cooled argon was supplied to the nozzle at 21 psig and −173 C (100 K) to generate a fluid treatment beam aimed onto the wafer 200. The first test was conducted at a relatively lower pressure with the chamber pressure set at 4 Torr. In the first experiment at the lower pressure, the substrate was translated underneath the auxiliary chamber, through the treatment beam flowing at 15 SLM (standard liters per minute) to a position at which the beam was centered 75 mm from the center of the wafer. The wafer 200 was then left in a stationary position while 100 SLM flowed from the auxiliary chamber for 10 seconds. This experiment was repeated with a chamber pressure of 19 Torr.

After each test, the wafer surface was analyzed to examine the distribution of particles remaining on the wafer surface following the treatment. Generally, particles would be removed in the footprint of the resultant treatment beam, while particles would remain on the surface outside the footprint of the treatment beam.

The results of the tests at the 4 Torr (Test 1) and 19 Torr (Test 2) pressures are shown schematically in FIG. 5. The results show that the treatment beam formed at 4 Torr was much larger and more diffuse with an annular cleaning footprint 202 resulting on the wafer surface 201. This annular footprint 202 corresponded to the shape of the treatment beam emitted from the nozzle and onto the wafer 200 at a chamber pressure of 4 Torr. This is further shown by the corresponding cleaning profile 206 showing cleaning efficiency (i.e., percentage of particles removed from the surface 201) as a function of distance from the central axis 210 of the nozzle. Profile 206 shows an efficiency curve 208 in which cleaning occurred in an annular zone 212. Substantially no cleaning occurred directly below the nozzle as shown by the zone 214.

The treatment beam formed at 19 Torr was much smaller and more dense, shown by the tighter, circular cleaning footprint 204 on the wafer surface 201. This tighter footprint 204 corresponded to the shape of the treatment beam emitted from the nozzle and onto the wafer 200 at a chamber pressure of 19 Torr. The beam was more collimated and focused than the beam formed at 4 Torr. This is further shown by the corresponding cleaning profile 216 showing cleaning efficiency as a function of distance from the central axis 220 of the nozzle. Profile 216 shows an efficiency curve 218 in which cleaning occurred in circular zone 222. The beam formed at 19 Torr provided cleaning directly below the nozzle as shown by the corresponding cleaning profile. The central axis 220 of the nozzle is centered in the central area of the curve 218, showing that substantial cleaning occurred directly under the nozzle at 19 Torr.

The larger, annular beam formed at 4 Torr might be more desirable for larger cleaning area to provide higher throughput. By scanning the wafer, which may rotate and/or translate relative to the nozzle, the scan can clean whole wafer faster even though at any one point in time the area directly below the nozzle is not cleaned. The more diffuse flow formed at 4 Torr also may be more suitable for unpatterned substrates where delicate structures are not involved.

The more focused flow formed at 19 Torr may be better with respect to substrates having recesses as the beam has a more direct line of sight into such recesses as compared to a more lateral or angled flow. The smaller beam also may be more suitable to clean smaller particles, or more delicate structures.

The beam size is easily and rapidly controlled simply by adjusting the pressure. As a result, the beam size could be changed on demand as the same substrate is scanned. This way, some parts can be treated with one profile while other portions are treated with a different beam profile. Other portions could be treated in sequence with both profiles. Such sequences could be repeated through multiple cycles.

Example 2

Tests were conducted to evaluate how flow rate and chamber pressure impact the shape and size of fluid treatment beams used to clean particles from wafer surfaces. The tests were conducted using a 300 mm, bare silicon wafer having a surface contaminated with 30 nm silica particles. The contaminated wafer was exposed to fluid treatment beams in four different tests (Tests 3, 4, 5 and 6) using the conditions reported in Table 2-1.

To prepare each test wafer for testing, 30 nm silica particles were wet deposited onto the bare silicon wafer 200, aged for 1 hour, and then placed into a vacuum chamber in a cryogenic treatment tool according to FIG. 1 and FIG. 4. The tool was configured to have, the capability to control the chamber pressure. A nozzle was mounted in a cylindrical auxiliary chamber such that the nozzle orifice was 50 mm from the substrate. The nozzle orifice was 0.0925 inches (2.35 mm) in diameter. The nozzle also was recessed 27 mm within the cylindrical auxiliary chamber. The auxiliary chamber had a diameter of 42 mm.

For all four tests, pressurized and cooled argon was supplied to the nozzle −173 C (100 K) at the pre-expansion pressures shown in Table 2-1. The pressure and temperature of the argon as supplied to the nozzle were selected to help ensure that the pressurized and cooled argon supplied to the nozzle remained as a gas in the supply line to avoid liquid content. For all four tests, the fluid was ejected from the nozzle into the auxiliary chamber and then into the process chamber as a fluid treatment beam including gas clusters. Gas clusters are advantageous in order to provide excellent cleaning of large (over 100 nm) and smaller (under 100 nm) particles with a reduced risk of damaging device features as compared to using treatment beams made predominantly from liquid particles and/or solid particles.

TABLE 2-1

| Test | Flow rate of fluid to nozzle (slm) | Gap distance (mm) | Nozzle orifice diameter (mm) | Chamber pressure (Torr) | Pre-expansion pressure (psig) |
|---|---|---|---|---|---|
| 3 | 160 | 50 | 2.35 | 7 | 21 |
| 4 | 160 | 50 | 2.35 | 19 | 21 |
| 5 | 100 | 50 | 2.35 | 4 | 9 |
| 6 | 100 | 50 | 2.35 | 19 | 9 |

For each test, the beam was located and used to clean the wafer for 10 seconds at a static location. After each test, the wafer surface was analyzed to examine the distribution of particles remaining on the wafer surface following the treatment. Generally, particles would be removed in the footprint of the resultant treatment beam, while particles would remain on the surface outside the footprint of the treatment beam.

Figures 6A, 6B:
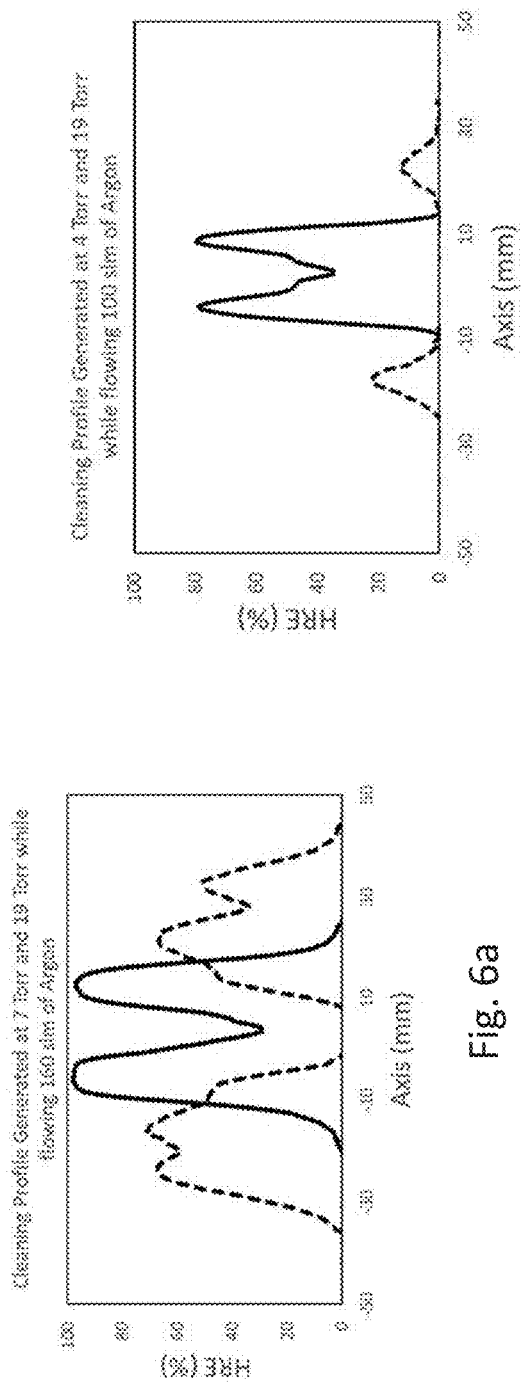
FIG. 6a shows cleaning profiles obtained for Tests 3 and 4 of Example 2.
FIG. 6b shows cleaning profiles obtained for Tests 5 and 6 of Example 2.

The results of the tests are shown in FIGS. 6a and 6b. FIG. 6a shows shows a plot of HRE (%) as a function of distance from the nozzle axis (mm) for Test 3 (dotted line) and Test 4 (solid line). FIG. 6b shows a plot of HRE (%) as a function of distance from the nozzle axis (mm) for Test 5 (dotted line) and Test 6 (solid line). HRE (%) refers to the haze removal efficiency, as a function of distance from the central nozzle axis. This is expressed as the percentage change in the haze signal when particles are intentionally deposited on a bare silicon wafer to purposely change the haze level and then subsequently processed to determine if the haze signal changed as a result. A change in the haze signal in the region that is exposed during processing from the nozzle dispense translates to cleaning. This approach is a way to get fine details about beam profiles on small particles that may be smaller than the resolution of particle scanning tools.

With respect to tests 3 and 4 conducted at 160 slm, FIG. 6a shows that using a relatively higher chamber pressure of 19 Torr results in a tighter cleaning beam (diameter about 40 mm with a 20 mm radius extending from the nozzle axis) with cleaning directly under the nozzle, although more cleaning occurred at a radius of about 10 mm as compared to directly under the nozzle. The footprint of this cleaning beam was generally circular. In contrast, lowering the chamber pressure to 7 torr caused the beam to have a wider, annular footprint (extending radially outward from about 5 mm to about 40 mm from the nozzle axis such that the diameter of the inner annulus boundary is about 10 mm and the diameter of the outer annulus boundary is about 80 mm) with substantially no cleaning occurring directly under the nozzle. Also, the beam intensity was lower in the annulus, as shown by the lower HRE peaks of Test 4 compared to test 3.

As shown by FIG. 6a, similar result patterns are seen for Tests 5 and 6 carried out at 100 slm, although the lower flow rate of 100 slm compared to 160 slm provided beams with less intensity as shown by the smaller HRE peaks. Test 5 (solid line) at a chamber pressure of 19 Torr produced a relatively tight, circular beam with cleaning under the nozzle. In contrast, Test 6 (dotted line) at a chamber pressure of 4 torr produced a wider, annular beam with smaller HRE peaks.

The results for Tests 5 and 6 occurring with a flow rate of 100 slm and using a nozzle orifice of 2.35 mm can also be compared to the results of using 100 slm and a smaller nozzle orifice of 1.9 mm in Example 1. The cleaning efficiency in Example 1 was higher, indicating that the same flow with a more restricted nozzle orifice tends to provide a higher energy beam with higher cleaning efficiency. Hence, using a smaller orifice may be useful in many modes of practice to get higher cleaning efficiency, although using a larger orifice may still be useful to avoid unduly harming sensitive device features being treated.

Example 3

Tests were conducted to evaluate how flow rate, nozzle orifice size, and gap distance (shown as gap distance 126 in FIG. 4) impact the shape and size of fluid treatment beams used to clean particles from wafer surfaces. The tests were conducted using a 300 mm, bare silicon wafer having a surface contaminated with 100 nm silica particles. The contaminated wafer was exposed to fluid treatment beams in three different tests (Tests 7, 8 and 9) using the conditions reported in Table 3-1. For all three tests, pressurized and cooled argon was supplied to the nozzle −173 C (100 K) at the pre-expansion pressures shown in Table 3-1. The pressure and temperature were selected to help ensure that the pressurized and cooled argon supplied to the nozzle remained as a gas in the supply line to avoid liquid content. For all three tests, the nozzle was positioned with its outlet orifice outside the auxiliary chamber and projecting into the process chamber so that the nozzle outlet was not recessed in the auxiliary chamber. The auxiliary chamber still opened above the ejected beam and this open volume above the beam axis is believed to still help with beam shaping responsive to pressure changes. The fluid was ejected from the nozzle into the process chamber as a fluid treatment beam including gas clusters. Gas clusters are advantageous in order to provide excellent cleaning of large (over 100 nm) and smaller (under 100 nm) particles with a reduced risk of damaging device features as compared to using treatment beams made predominantly from liquid particles and/or solid particles.

TABLE 3-1

| Test | Flow rate of fluid to nozzle (slm) | Gap distance (mm) | Nozzle orifice diameter (mm) | Chamber pressure (Torr) | Pre-expansion pressure (psig) |
| --- | --- | --- | --- | --- | --- |
| 7 | 160 | 3.5 | 2.3 | 8 | 21 |
| 8 | 90 | 22.5 | 1.9 | 19 | 19 |
| 9 | 80 | 22.5 | 1.9 | 19 | 17 |

For each test, the beam was located and used to clean the wafer for 10 seconds at a static location. After each test, the wafer surface was analyzed to examine the distribution of particles remaining on the wafer surface following the treatment. Generally, particles would be removed in the footprint of the resultant treatment beam, while particles would remain on the surface outside the footprint of the treatment beam.

Figure 7:
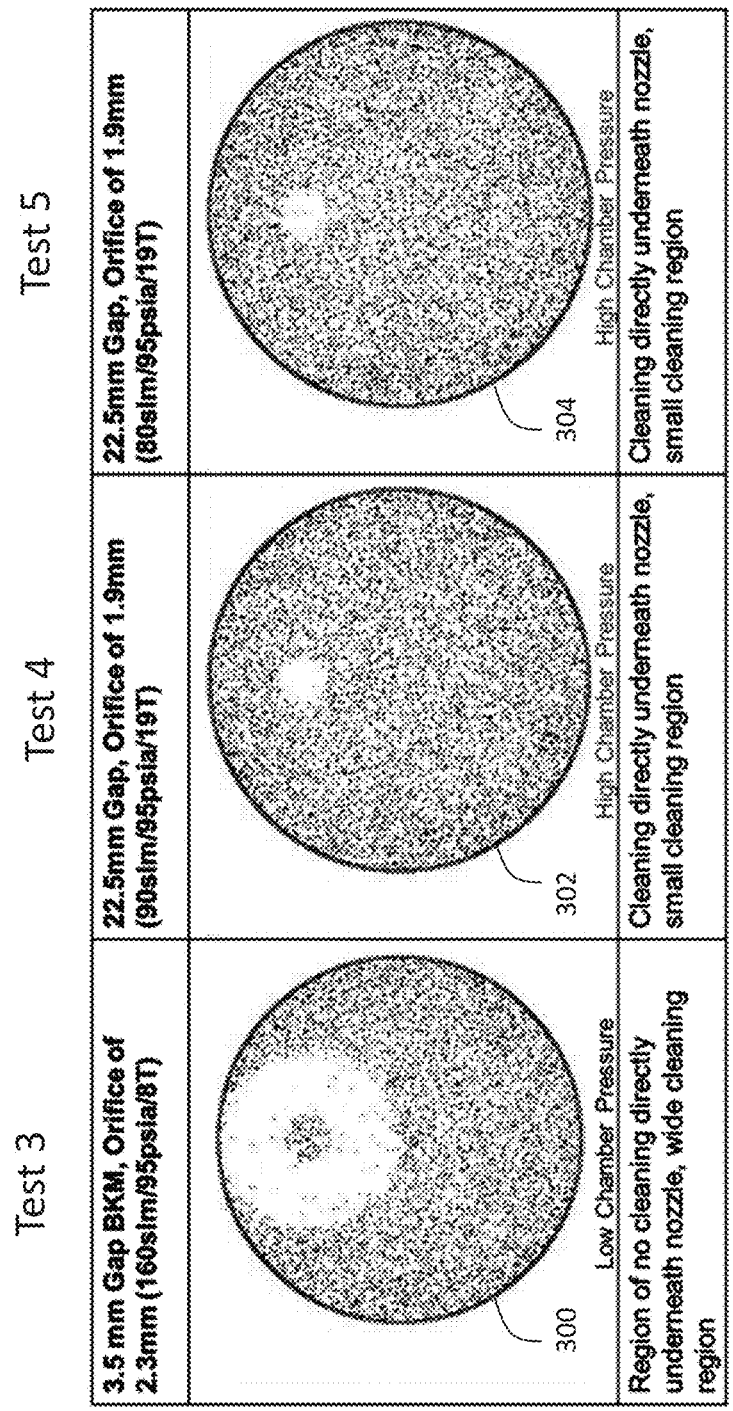
FIG. 7 shows test results in the form of particle wafer maps that show how adjusting tool configuration and process conditions can be used to tune the size an shape of treatment beams and their cleaning profiles.
Figure 8:
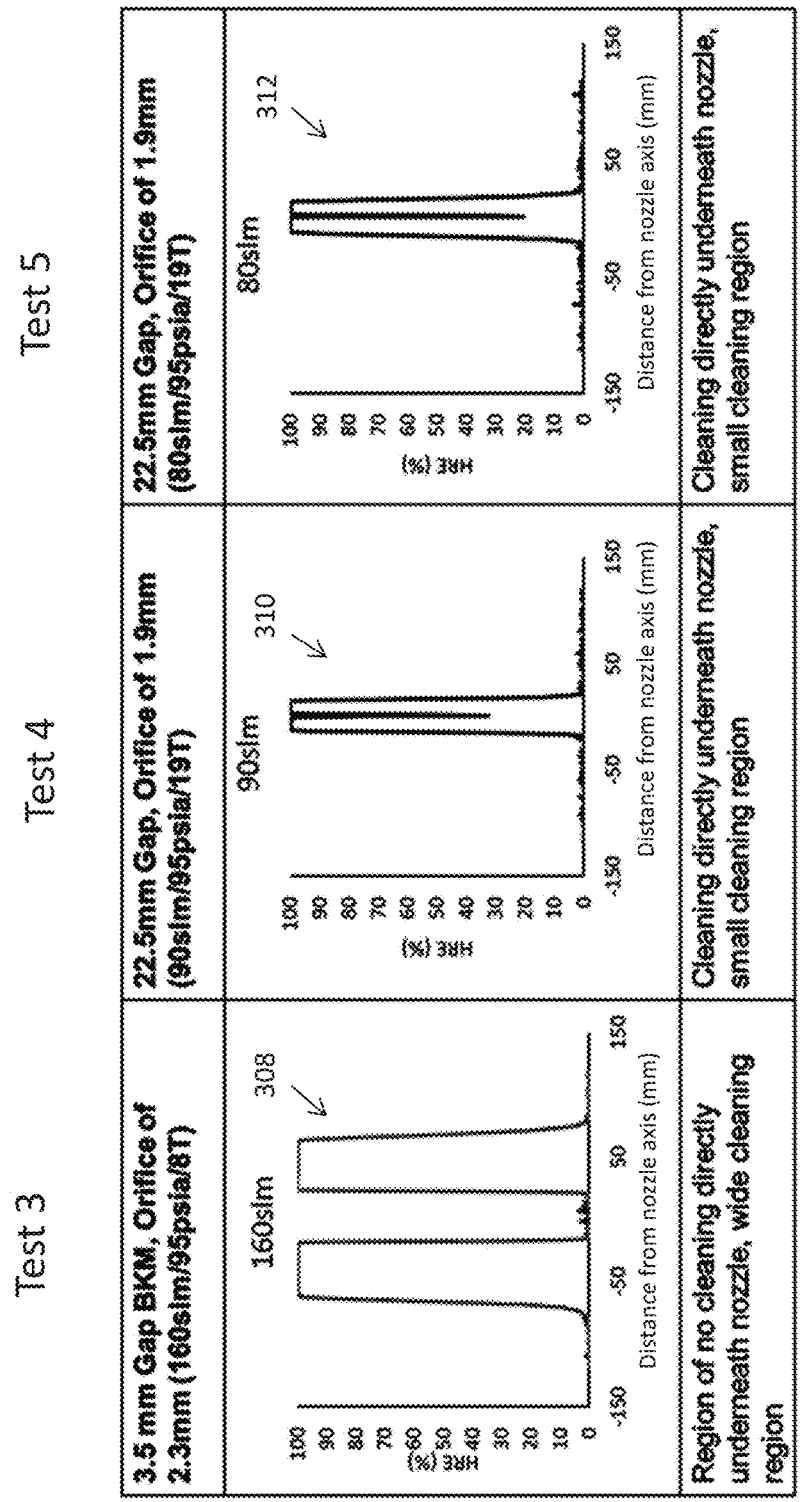
FIG. 8 shows test results corresponding to the particle wafer maps of FIG. 7, wherein the test results of FIG. 8 are in the form of cleaning efficiency profiles.

The results of the tests are shown in FIGS. 7 and 8. FIG. 7 shows wafer cleaning maps 300 (Test 3), 302 (Test 4), and 304 (Test 5). The maps show cleaned areas that correspond to the shape of the resultant treatment beam as well as uncleaned areas that correspond to areas of the wafer surface outside the treatment beam. FIG. 8 shows cleaning efficiency profiles 308 (Test 7), 310 (Test 8) and 312 (Test 9) resulting from each test. The profiles 308, 310, and 312 show cleaning efficiency expressed as HRE (%).

Wafer map 300 and cleaning efficiency profile 308 show how the beam generated with a small gap, large orifice, low chamber pressure, and high flow rate generates a annular beam that generates an annular shaped cleaning footprint on the wafer surface. This provides a wide cleaning region with substantially no cleaning directly under the nozzle. Using this kind of beam to clean a rotating and/or translating wafer would rapidly treat the entire wafer surface with high throughput.

The ability of Test 7 to provide an annular shaped cleaning beam with such a small gap between the auxiliary chamber and the wafer surface is counterintuitive and beneficial. Without wishing to be bound, a possible theory to explain the resultant annular shape when using gas cluster treatment beams can be suggested. It is believed that the central area below the nozzle might be a region of relatively higher pressure as compared to the annular region in which cleaning occurs. In such a high pressure region, the gas clusters might not be effective cleaning agents with such close gap spacing as many collisions among the gas clusters might occur to use up the energy in the central region so that the energy is not available for cleaning. The result is a so-called deadspot directly under the nozzle that might be uniquely associated with using close gap spacing with gas clusters at high flow rates using a large nozzle orifice at lower chamber pressure. In contrast, the gas clusters are more likely to retain more kinetic energy in the annulus region to accomplish cleaning there.

Wafer maps 302 and 304 and cleaning efficiency profiles 310 and 312 show how using a larger gap spacing, smaller orifice, and higher chamber pressure provide conditions under which a gas cluster treatment beam can be used that is highly focused and collimated to produce a smaller treatment beam that cleans directly under the nozzle. Such focused, collimated beams would have higher energy density than the more diffuse annular beam resulting from Test 7. In the aforementioned description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

All patents, patent applications, and publications cited herein are incorporated by reference in their respective entireties for all purposes. The foregoing detailed description has been given for clarity of understanding only. No unnecessary limitations are to be understood therefrom. The invention is not limited to the exact details shown and described, for variations obvious to one skilled in the art will be included within the invention defined by the claims.

The invention claimed is:

1. A system for treating a microelectronic workpiece with a treatment spray, comprising:
   a. a vacuum process chamber comprising a workpiece holder on which the microelectronic workpiece is positioned during a treatment, wherein the vacuum process chamber comprises a controllable vacuum pressure;
   b. an auxiliary chamber that is in fluid communication with the vacuum process chamber in a manner such that a shaped fluid treatment beam dispensed from the auxiliary chamber into the vacuum process chamber is aimed onto the microelectronic workpiece positioned on the workpiece holder;
   c. a nozzle that is in fluid communication with the auxiliary chamber such that the nozzle dispenses a fluid spray into the auxiliary chamber in a manner such that the fluid spray dispensed from the nozzle is confined and shaped into a shaped fluid beam in the auxiliary chamber prior to being dispensed from the auxiliary chamber into the vacuum process chamber such that the shaped fluid treatment beam is adjustable on demand to be more focused responsive to increasing the controllable vacuum pressure or more diffuse responsive to reducing the controllable vacuum pressure, wherein the auxiliary chamber has a cylindrical geometry having a central axis, wherein the nozzle is deployed on the central axis, wherein the auxiliary chamber comprises a sidewall and a cover, and wherein the nozzle is recessed from the sidewall and the cover of the auxiliary chamber; and
   d. a control system comprising program instructions that controllably collimates the shaped fluid treatment beam to be more focused or more diffuse on demand by one or more process control steps comprising controlling the controllable vacuum pressure.

2. The system of claim 1, wherein the process chamber comprises a ceiling overlying the workpiece, and wherein the ceiling of the process chamber is positioned in a manner effective to provide a gap between the ceiling and the substrate that helps to cause the shaped fluid treatment beam to flow radially outward across the microelectronic workpiece.

3. The system of claim 2, wherein the gap is in the range from 20 mm to 100 mm.

4. The system of claim 1, wherein the control system tunes the controllable vacuum pressure during the course of a treatment.

5. The system of claim 1, wherein the control system tunes the controllable vacuum pressure during the course of different treatments.

6. The system of claim 1, wherein the control system adjusts the controllable vacuum pressure to treat a common area on a substrate in a sequence of fluid treatment beams with different sizes.

7. The system of claim 1, wherein the control system adjusts the controllable vacuum pressure in a manner such that a first treatment portion occurs with a relatively large fluid treatment beam and a second treatment portion occurs before or after the first treatment using a relatively more concentrated fluid treatment beam.

8. The system of claim 1, wherein the controllable vacuum pressure is in a range from 1 milliTorr to 750 Torr.

9. The system of claim 1, wherein the controllable vacuum pressure is under 50 Torr.

10. The system of claim 1, wherein the controllable vacuum pressure is under 25 Torr.

11. The system of claim 1, wherein the nozzle has a deployment in the auxiliary chamber that is symmetrical and recessed.

12. The system of claim 1, wherein a pressurized and cooled fluid is supplied to the nozzle, wherein the pressurized and cooled fluid is at a temperature in the range from 70 K to 150 K and a pressure in the range from 10 psig to 100 psig such that at least 99 weight percent of the pressurized and cooled fluid is in a gas phase.

13. The system of claim 1, wherein a pressurized and cooled fluid is supplied to the nozzle, wherein the pressurized and cooled fluid is at a temperature in the range from 70 K to 150 K and a pressure in the range from 10 psig to 100 psig such that at least 10 weight percent of the pressurized and cooled fluid is in a liquid phase and less than 1 weight percent is in a solid phase.

14. The system of claim 1, wherein a pressurized and cooled fluid is supplied to the nozzle, wherein the pressurized and cooled fluid comprises nitrogen and/or argon.

15. The system of claim 1, wherein a pressurized and cooled fluid is supplied to the nozzle, wherein the pressurized and cooled fluid comprises nitrogen.

16. The system of claim 1, wherein a pressurized and cooled fluid is supplied to the nozzle, wherein the pressurized and cooled fluid comprises argon.

17. The system of claim 1 wherein the nozzle has an outlet orifice that is recessed in the auxiliary chamber by a distance in the range from 5 mm to 200 mm relative to an outlet of the auxiliary chamber.

18. The system of claim 1, wherein the nozzle comprises a first body coupled to a fluid supply and a second body comprising a nozzle orifice, wherein the second body is removably attached to the first body.

19. A system for treating a microelectronic workpiece with a treatment spray, comprising;
    a. a vacuum process chamber comprising a workpiece holder on which the microelectronic workpiece is positioned during a treatment, wherein the vacuum process chamber comprises a controllable vacuum pressure;
    b. a nozzle system that delivers a shaped fluid treatment beam into the vacuum process chamber and onto the microelectronic workpiece, said nozzle system comprising (1) an auxiliary chamber in fluid communication with the vacuum process chamber and (2) a nozzle housed and recessed in the auxiliary chamber, wherein:
        i. the nozzle is fluidly coupled to a fluid supply system comprising a pressurized and cooled fluid, said nozzle spraying the pressurized and cooled fluid into the auxiliary chamber;
        ii. the fluid spray dispensed into the auxiliary chamber is confined and shaped into a shaped fluid beam in the auxiliary chamber; and
        iii. the auxiliary chamber is in fluid communication with the vacuum process chamber and is positioned over the workpiece holder in a manner such that the shaped fluid beam is dispensed from the auxiliary chamber into the vacuum process chamber as the shaped fluid treatment beam that is aimed onto the microelectronic workpiece positioned on the workpiece holder, said shaped fluid treatment beam being adjustable on demand to be more focused responsive to increasing the controllable vacuum pressure or more diffuse responsive to reducing the controllable vacuum pressure, and
    c. a control system comprising program instructions that controllably collimates the shaped fluid treatment beam to be more focused or more diffuse on demand by one or more process control steps comprising controlling the controllable vacuum pressure; and
    wherein the auxiliary chamber has a cylindrical geometry having a central axis, wherein the nozzle is deployed on the central axis, wherein the auxiliary chamber comprises a sidewall and a cover, and wherein the nozzle is recessed from the sidewall and the cover of the auxiliary chamber.

20. The system of claim 19, wherein the process chamber further comprises a ceiling overlying the workpiece, wherein the ceiling of the process chamber is positioned in a manner effective to provide a gap between the ceiling and the substrate that helps to cause the shaped fluid treatment beam to flow radially outward across the microelectronic workpiece.

21. A method of treating a microelectronic workpiece with a treatment fluid, comprising the steps of:
    a. providing a microelectronic workpiece, wherein the microelectronic workpiece is supported on a workpiece holder in a vacuum process chamber, wherein the vacuum process chamber has a controllable vacuum pressure;
    b. spraying a pressurized and cooled fluid through a nozzle into an auxiliary chamber having a cylindrical geometry, a sidewall and a cover, wherein the nozzle comprises a nozzle orifice that is recessed inside the auxiliary chamber by a recess distance relative to an auxiliary chamber outlet that opens into the vacuum process chamber, and wherein the nozzle orifice is recessed from the sidewall and the cover of the auxiliary chamber;
    c. shaping the sprayed pressurized and cooled fluid in the auxiliary chamber to provide a shaped fluid beam such that the shaped fluid beam is adjustable on demand to be more focused responsive to increasing the controllable vacuum pressure or more diffuse responsive to reducing the controllable vacuum pressure;
    d. dispensing the shaped fluid beam from the auxiliary chamber into the vacuum process chamber and onto the microelectronic workpiece as a dispensed, shaped fluid treatment beam having a beam size, wherein the beam size is adjusted by pressure changes in the vacuum process chamber such that the beam size can be adjusted on demand by adjusting the controllable vacuum pressure; and
    e. providing a control system that varies the controllable vacuum pressure to maintain or adjust the beam size of the dispensed, shaped fluid treatment beam to be more focused or more diffuse on demand.

22. The method of claim 21, wherein the process chamber comprises a ceiling overlying the workpiece, and further comprising the step of positioning the ceiling sufficiently close to the substrate to provide a gap between the ceiling and the substrate that helps to cause the shaped fluid treatment beam to flow radially outward across the microelectronic workpiece.

23. A method of treating a microelectronic workpiece with a treatment fluid, comprising the steps of:
    a) providing a microelectronic workpiece, wherein the microelectronic workpiece is supported on a holder in a vacuum process chamber, wherein the vacuum process chamber has a controllable vacuum pressure;
    b) providing an auxiliary chamber that is in fluid communication with the vacuum process chamber via an auxiliary chamber outlet above the microelectronic workpiece;
    c) spraying a pressurized and cooled fluid into the auxiliary chamber from a nozzle orifice that is recessed inside the auxiliary chamber from the auxiliary outlet, a sidewall of the auxiliary chamber, and a cover of the auxiliary chamber;

d) using the sprayed fluid dispensed into the auxiliary chamber to form a fluid treatment beam having a beam size, wherein the beam size is adjusted by pressure changes in the vacuum process chamber such that the beam size can be adjusted on demand by adjusting the controllable vacuum pressure such that the beam size is more concentrated with higher pressure and more diffuse with lower pressure; and e) dispensing the fluid treatment beam from the auxiliary chamber onto the microelectronic workpiece.

24. The method of claim 22, further comprising the step of controlling the vacuum pressure of the vacuum process chamber to adjust the beam size of the fluid treatment beam.

25. A system for treating a microelectronic workpiece with a treatment spray, comprising:
 a. a housing defining a vacuum process chamber, said vacuum process chamber comprising a workpiece holder on which the microelectronic workpiece is positioned during a treatment, and wherein the housing comprises a cover structure and a controllable vacuum pressure;
 b. an auxiliary chamber fluidly coupled to the vacuum process chamber through an auxiliary chamber outlet in the cover structure that provides an egress from the auxiliary chamber into the vacuum process chamber, wherein the footprint of the auxiliary chamber outlet is smaller than the footprint of the microelectronic workpiece;
 c. a fluid supply system comprising one or more fluids;
 d. a spray nozzle, wherein the spray nozzle is coupled to the fluid supply system in a manner effective to dispense the one or more fluids as a fluid spray, wherein the spray nozzle is recessed in the auxiliary chamber such that the fluid spray is dispensed into the auxiliary chamber and then is dispensed from the auxiliary chamber onto the microelectronic workpiece in the vacuum process chamber such that the fluid treatment spray dispensed into the vacuum process chamber is adjustable on demand to be more focused responsive to increasing the controllable vacuum pressure or more diffuse responsive to reducing the controllable vacuum pressure; wherein the auxiliary chamber has a cylindrical geometry having a central axis; wherein the nozzle is deployed on the central axis; wherein the auxiliary chamber comprises a sidewall and a cover; and wherein the nozzle is recessed from the sidewall and the cover of the auxiliary chamber; and
 e. a control system comprising program instructions that controllably collimates the shaped treatment spray to be more focused or more diffuse on demand by one or more process control steps comprising controlling the controllable vacuum pressure.

26. A system for treating a microelectronic workpiece with a treatment spray, comprising:
 a. a vacuum process chamber comprising a workpiece holder on which the microelectronic workpiece is positioned during a treatment, wherein the vacuum process chamber comprises a controllable vacuum pressure;
 b. an auxiliary chamber that is in fluid communication with the vacuum process chamber and that has an outlet overlying the workpiece during the treatment; and
 c. a nozzle projecting into the vacuum process chamber, said nozzle having a nozzle outlet orifice that opens into the vacuum process chamber and positioned so that the auxiliary chamber and the outlet of the auxiliary chamber overlie the nozzle outlet orifice when the treatment spray is dispensed from the nozzle outlet orifice to treat the workpiece and so that the auxiliary chamber helps to shape the treatment spray responsive to pressure changes in the vacuum pressure chamber such that the beam size is more concentrated with higher pressure and more diffuse with lower pressure; and
 d. a control system comprising program instructions that controllably collimates the shaped treatment spray to be more focused or more diffuse on demand by one or more process control steps comprising controlling the controllable vacuum pressure.

\* \* \* \* \*